United States Patent [19]
Kumagai et al.

[11] Patent Number: 5,780,884
[45] Date of Patent: Jul. 14, 1998

[54] AMPLICATION TYPE SOLID-STATE IMAGING DEVICE

[75] Inventors: Kazuya Kumagai, Tenri; Hiroaki Kudo, Nara, both of Japan

[73] Assignee: Sharp Kabushiki Kaisha, Osaka, Japan

[21] Appl. No.: 744,618

[22] Filed: Nov. 6, 1996

[30] Foreign Application Priority Data

Mar. 13, 1996 [JP] Japan ................................. 8-056578

[51] Int. Cl.$^6$ ................................................. H01L 29/78
[52] U.S. Cl. ........................... 257/236; 257/231; 257/249
[58] Field of Search ............................ 257/231, 236, 257/249

[56] References Cited

U.S. PATENT DOCUMENTS

| | | | |
|---|---|---|---|
| 4,498,013 | 2/1985 | Kuroda et al. | 257/230 |
| 5,235,197 | 8/1993 | Chamberlain et al. | 257/230 |
| 5,306,932 | 4/1994 | Miwada | 257/236 |

OTHER PUBLICATIONS

IBM Technical Disclosure Bulletin, "Preventing Overload In Optical Scanners", Gaffney et al., vol. 17, No. 8, May 1975, pp. 3529–3530.

K. Matsumoto, et al., *IEEE Transactions On Electron Devices*, "The Operation Mechanism of a Charge Modulation Device (CMD) Image Sensor", vol. 38, No. 5, pp. 989–998, 1991.

J. Hynecek, et al., *IEEE Transactions on Electron Devices*, "A New Device Archtecture Suitable for High–Resolution and High–Performance Image Sensors", vol. 35, No. 5, pp. 646–652, 1988.

J. Hynecek, et al., *IEEE Transactions On Electron Devices*, "BCMD–An Improved Photosite Structure for High–Density Image Sensors", vol. 38, No. 5, pp. 1101–1020, 1991.

E.R. Fossum, *IEDM 95*, "CMOS Image Sensors: Electronic Camera On a Chip", pp. 17–25, 1995.

T. Watanabe, U.S. Patent Application No.: 08/382,257, filed Feb. 1, 1995.

*Primary Examiner*—Tom Thomas
*Assistant Examiner*—David B. Hardy
*Attorney, Agent, or Firm*—David G. Conlin; Brian L. Michaelis

[57] ABSTRACT

The amplification type solid-state imaging device of this invention includes amplification type photoelectric converting elements arranged in a matrix. Each of the amplification type photoelectric converting elements includes: a transistor formed at a surface of a semiconductor substrate, for accumulating signal charge generated from incident light on a portion of the transistor at the surface of the semiconductor substrate and outputting an output signal comprising a change in an electric signal corresponding to the accumulated signal charge; a gate region formed adjacent to the transistor, including a portion of the semiconductor substrate, an insulating film formed on the portion of the semiconductor substrate, and a gate electrode formed on the insulating film, the gate region allowing the accumulated signal charge to move from the surface of the semiconductor substrate to the inside of the semiconductor substrate; and an output impedance converting section connected to the photoelectric converting elements which sequentially receives the output signals from the amplification type photoelectric converting elements, the output impedance converting section including a driving transistor driven with the output signals and a load transistor.

3 Claims, 16 Drawing Sheets

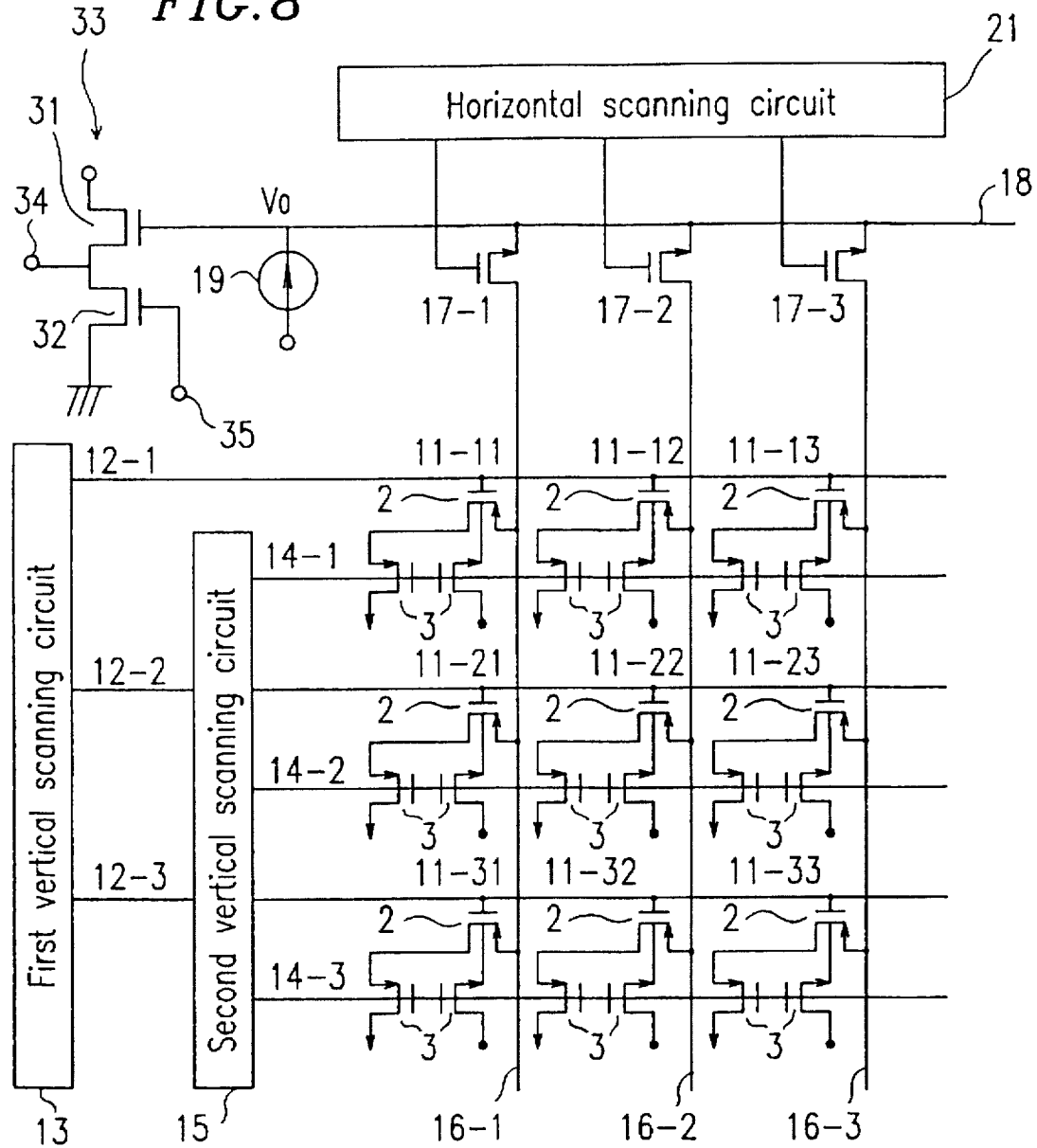

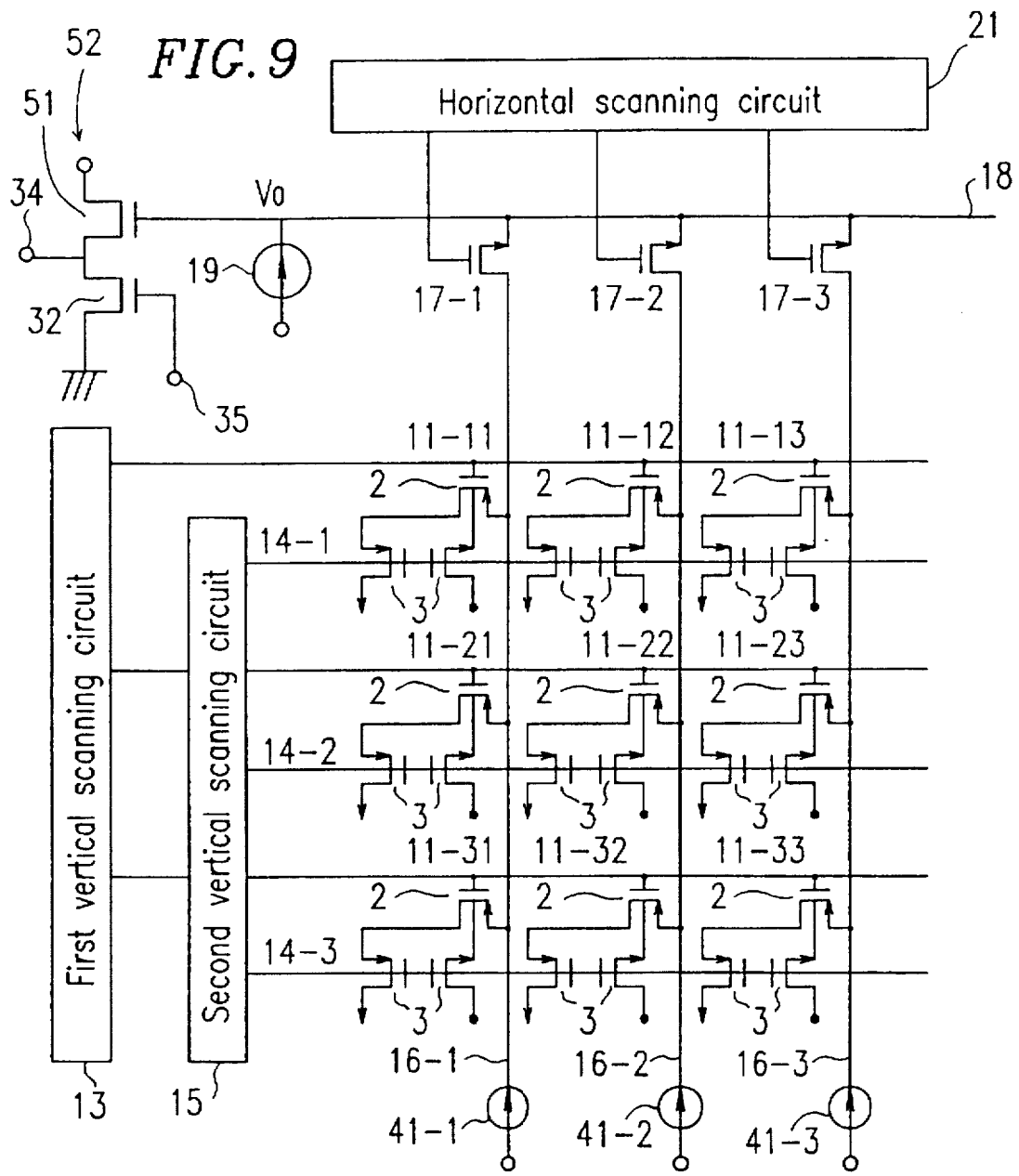

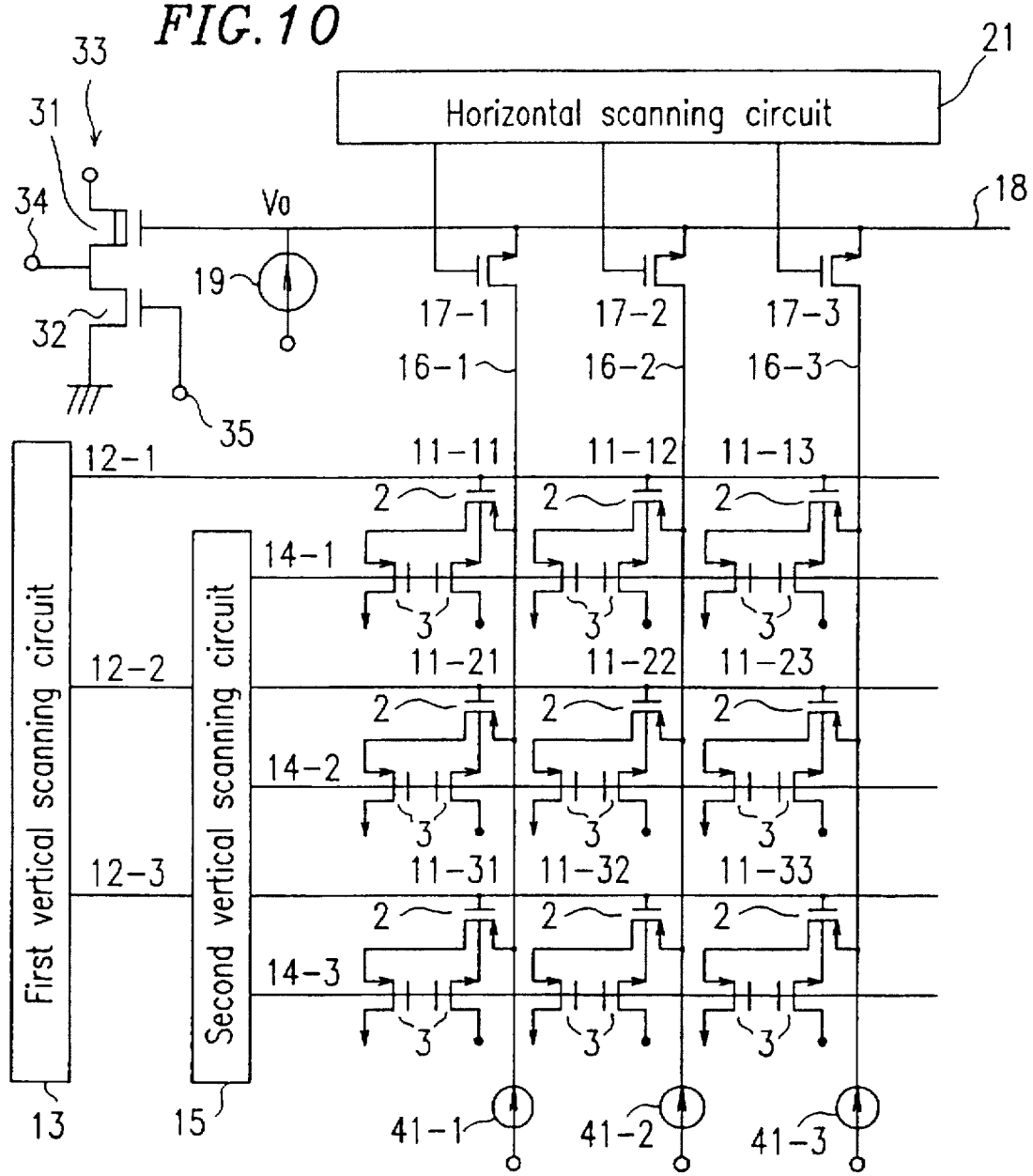

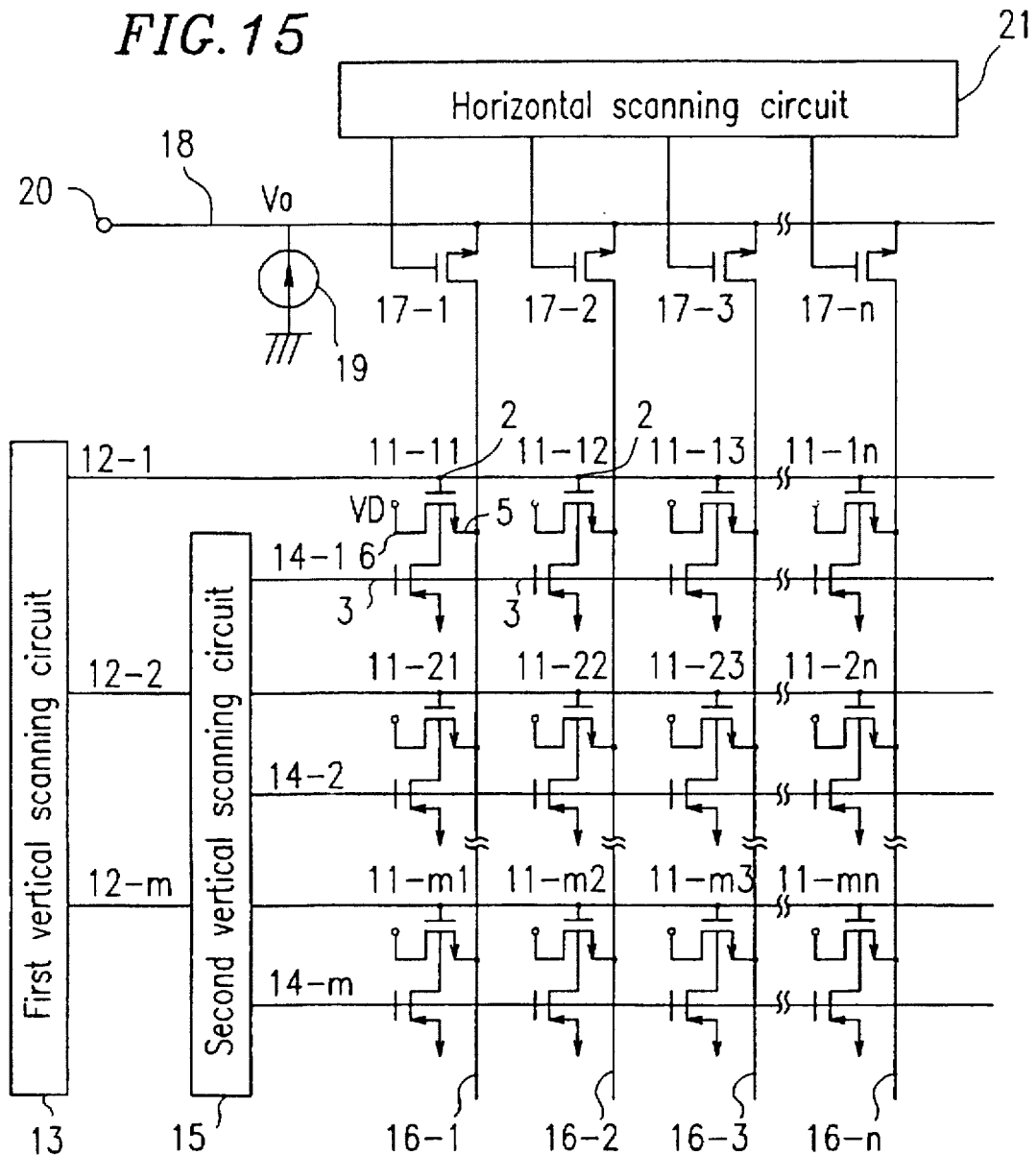

AMPLICATION TYPE SOLID-STATE IMAGING DEVICE

BACKGROUND OF THE INVENTION

1. Field of the Invention

The present invention relates to an amplification type solid-state imaging device including an array of amplification type solid-state imaging elements each having a transistor such as an MOSFET and a junction gate FET which accumulates signal charge obtained by photoelectric conversion of incident light and outputs electric signals corresponding to the accumulated signal charge.

2. Description of the Related Art

A charge-coupled device (CCD) type solid-state imaging device has been widely used in various fields as a featuring device of a solid-state imaging device. In a CCD type imaging device, signal charge, which is photoelectrically-converted and accumulated by a photodiode or a MOS diode, are transferred via a CCD transfer channel to a high-sensitivity charge detection portion and converted there into voltage signals. As a result, the CCD type imaging device has a higher signal-to-noise (S/N) ratio and a larger output voltage.

However, in order to meet the demand that such an imaging device should be smaller-sized and have a larger number of pixels, the size of a pixel to be used should be smaller and the amount of charge that can be transferred by a CCD should be reduced. Consequently, there have occurred serious problems such as a scale-down of the dynamic range, a significant increase of the power consumption, and the like. Because a larger amount of load capacitance and a higher driving voltage are required to drive the entire CCD device by several phases of clocks, the power consumption sharply increases as a larger number of pixels are used.

In order to overcome the above problems, an amplification type solid-state imaging device has been proposed, where signal charge generated in each pixel is not directly read, but a signal is first amplified in each pixel and read via a scanning circuit. By amplifying the signal in each pixel, the signal is no more limited, providing a wider dynamic range than the CCD type device. Moreover, only a horizontal line and a vertical line corresponding to a selected pixel from which a signal is to be read can be driven, and the required driving voltage is low. This reduces the power consumption compared with the CCD device.

Transistors are generally used for the above signal amplification in each pixel. Among various types of transistors such as a SIT, a bipolar type transistor, and a FET (a MOSFET and a junction type FET), a FET is advantageously used in consideration of the construction of the entire device since it is easy in construction to use a MOSFET for a scanning circuit for signal readout. (While a SIT and a bipolar type transistor are formed in the depth direction, a FET is formed in the plane direction, which facilitates the fabrication of the transistor).

FIG. 11A is a partial plan view of an amplification type solid-state imaging device, showing pixels of amplification type solid-state imaging elements of a so-called twin gate MOS image sensor (TGMIS) type. This type of the element has been proposed in Japanese Patent Application No. 6-303953 by the Applicant of the present application, which was published as Japanese Laid-Open Patent Publication No. 8-78653 on Mar. 22, 1996. FIG. 11B is a sectional view taken along line A-A' of FIG. 11A.

Referring to FIG. 11B, first gate electrodes 2 and second gate electrodes 3 are formed on a p-type semiconductor substrate 1 via an insulating film. Well layers 4 are formed in regions of the surface area of the semiconductor substrate 1 located directly under the first gate electrodes 2. Source regions 5 and drain regions 6 made of n+ diffusion layers are formed in the surface areas of the well layers 4 to constitute respective MOS type transistors together with the corresponding first gate electrodes 2 as a gate.

Referring to FIG. 11A, each first gate electrode 2 surrounds the source region 5 of each MOS type transistor, forming a pixel. Such pixels are arranged in the horizontal and vertical directions. The first gate electrodes 2 of horizontally adjacent pixels are connected to each other via horizontal connecting sections 2a. The second gate electrodes 3 are formed directly under the horizontal connecting sections 2a. Each drain region 6 surrounds the first gate electrode 2 and the second gate electrode 3 of each pixel.

Drain terminals VD are connected to the drain regions 6, while signal read terminals VS are connected to the source regions 5 via signal lines (column lines) connected to respective columns of pixels aligned in the vertical direction. Control terminals VGA are connected to the first gate electrodes 2, while control terminals VGB are connected to the second gate electrodes 3.

With the above configuration, a light energy hv incident via each first gate electrode 2 causes pairs of electrons and holes to be generated in the transistor by photoelectric conversion. While electrons flow into the drain region 6, holes are confined by a barrier formed in the middle of the n-type well layer and a barrier formed under the second gate electrode 3 to become signal charge accumulated at the semiconductor/insulating film interface of the n-type well layer 4. The potential in the n-type well layer 4 changes depending on the amount of the accumulated signal charge. The amount of this change in the potential is read via the signal read terminal VS as a change in the source potential and output as a pixel signal.

The signal charge is drained in a reset operation after the above signal read operation. This can be easily achieved by lowering the potential barrier under the second gate electrode 3 to allow the accumulated signal charge to flow transversely toward the region located under the second gate electrode 3 and then vertically toward the p-type semiconductor substrate 1 as shown by an arrow 7 in FIG. 11B.

FIG. 12A is a partial plan view of another amplification type solid-state imaging device, showing pixels of amplification type solid-state imaging elements of a so-called surface reset type obtained by improving the above TGMIS type. This type of imaging element has been proposed in Japanese Patent Application No. 8-19199 by the Applicant of the present application. FIG. 12B is a sectional view taken along line A-A' of FIG. 12A.

Referring to FIGS. 12A and 12B, n-type semiconductor well layers 4 are formed in the surface area of a p-type semiconductor substrate 1. First gate electrodes 2 which are to be part of first gate regions are formed on the n-type semiconductor well layers 4, while second gate electrodes 3 which are to be part of second gate regions are formed on the exposed portions of the p-type semiconductor 1 located adjacent to the n-type semiconductor well layers 4. P-type low-resistance surface reset drains 8 are formed in the second gate regions between the adjacent n-type semiconductor well layers 4 before the formation of the second gate electrodes 3, to secure regions where potential barriers are formed by the second gate electrodes 3. Thereafter, $n^+$-type diffusion layers are formed for sources 5 and drains 6 which constitute respective MOS type transistors together with the corresponding first gate electrodes 2 as a gate. The reset drains 8 are formed in the surface area of the semiconductor substrate 1 under the second gate electrodes 3.

With the above configuration, a light energy hv incident via each first gate electrode 2 causes pairs of electrons and holes to be generated in a photoelectric conversion region of the n-type semiconductor well layer 4 by photoelectric conversion. While electrons flow into the drain region, holes are confined by a barrier formed in the middle of the n-type semiconductor well layer 4 and a barrier formed under the second gate electrode 3 to become signal charge accumulated at the semiconductor/insulating film interface of the first gate region. The potential in the n-type semiconductor well layer 4 changes depending on the amount of the accumulated signal charge. The amount of this change in the potential is read as a potential change in the source 5 and output as a pixel signal.

The signal charge is easily drained in the reset operation by lowering the potential barrier under the second gate electrode 3 to allow the accumulated signal charge to flow into the reset drain 8 via a route shown by an arrow 7 in FIG. 12B. In this imaging device, the accumulated charge can be completely drained without influence of a potential ridge 107 formed in the middle between the semiconductor surface of the second gate region and the p-type semiconductor substrate 1. As for the potential ridge 107, refer to the aforementioned patent application.

Referring to FIG. 12A, each first gate electrode 2 surrounds the source region 5 of each MOS type transistor, forming a pixel. Such pixels are arranged in the horizontal and vertical directions, and the first gate electrodes 2 of horizontally adjacent pixels are connected to each other via horizontal connecting sections 2a. The second gate electrodes 3 are formed directly under the horizontal connecting sections 2a. Each drain region 6 surrounds the first gate electrode 2 and the second gate electrode 3 of each pixel.

Drain terminals VD are connected to the drain regions 6, while signal read terminals VS are connected to the source regions 5 via signal lines (column lines) connected to respective columns of pixels aligned in the vertical direction. Control terminals VGA are connected to the first gate electrodes 2, while control terminals VGB are connected to the second gate electrodes 3.

FIG. 13A is a partial plan view of yet another amplification type solid-state imaging device, showing pixels of amplification type solid-state imaging elements of a so-called trench type obtained by improving the above TGMIS type from another aspect. This type of imaging element has been disclosed in Japanese Patent Application No. 8-19200 by the Applicant of the present application. The configuration of this amplification type solid-state imaging device is the same as those shown in FIGS. 11A and 12A except for the formation of a trench structure in a portion between each second gate region and the adjacent drain region, and thus detailed description thereof is omitted. FIG. 13B is a sectional view taken along line A-A' of FIG. 13A.

Referring to FIGS. 13A and 13B, n-type semiconductor well layers 4 are formed in the surface area of a p-type semiconductor substrate 1. First gate electrodes 2 which are to be part of first gate regions are formed on the n-type semiconductor well layers 4, while second gate electrodes 3 which are to be part of second gate regions are formed on the exposed portions of the p-type semiconductor 1 located adjacent to the n-type semiconductor well layers 4. Then, $n^+$-type diffusion layers are formed for sources 5 and drains 6 which constitute respective MOS type transistors together with the corresponding first gate electrodes 2 as a gate.

The TGMIS type amplification type solid-state imaging device shown in FIGS. 11A and 11B has a problem such that, as the width of the second gate electrode becomes smaller with the reduction of the pixel size, a three-dimensional potential ridge is formed on a route for the drainage of the accumulated charge due to the potential applied to the source and the drain. This potential ridge prevents the accumulated charge from being completely drained into the semiconductor substrate.

In the trench-type device, a trench structure 9 is formed adjacent to the second gate region to suppress the formation of such a potential ridge. This makes it possible to spatially lower the potential applied to the source 5 and the drain 6 and thus secure a channel through which the accumulated charge flows into the semiconductor substrate 1.

The trench structure is not necessarily formed over the entire region adjacent to the second gate region, but may be formed only over a portion of the region since the accumulated charge can be completely drained by securing such a portion formed as a reset drain under the second gate region.

In the reset operation, a high voltage VGA(H) which is, for example, the same as that applied when signal charge is accumulated, is previously applied to the first gate electrode 2. An intermediate voltage VGA(M) which is, for example, the same as that applied when signal charge is accumulated, is applied to the second gate electrode 3. At this time, the surface potential under the second gate electrode 3 is sufficiently lower than the surface potential of the n-type semiconductor well layer 4 obtained when no signal exists. This allows all signal charge (holes) in the surface area of the n-type semiconductor well layer 4 to flow into the p-type semiconductor substrate 1 through the potential barrier gate under the second gate electrode 3. In other words, the reset operation is effected.

At this time, thanks to the existence of the trench structure 9, there is formed no potential ridge which tends to be formed in the middle of the region under the second gate electrode 3 preventing the accumulated charge from being drained.

FIG. 14A is a plan view of yet another application type solid-state imaging device, showing pixels of amplification type solid-state imaging elements of a so-called bulk drain MOS image sensor (BDMIS) type. This type of imaging element has been disclosed in Japanese Patent Application No. 7-51641 by the Applicant of the present application. FIG. 14B is a part of a sectional view taken along line A-A' of FIG. 14A.

Referring to FIG. 14B, n-type wells 4 are formed in the surface area of a p-type semiconductor substrate 1 so that the surface thereof is on the same level as a principal surface 11 of the p-type semiconductor substrate 1. A $p^+$-type semiconductor region 5 is formed in the surface area of each well 4 so that the surface thereof is on the same level as the principal surface 11. A first gate electrode 2 is formed on the well 4 excluding the area where the semiconductor region 5 is formed via an insulating film. A second gate electrode 3 is formed on the exposed surface of the semiconductor substrate 1 adjacent to the well 4 via the insulating film. The surface area of the well 4, the insulating film, and the first gate electrode 2 constitute a first gate region. Likewise, the exposed surface area of the semiconductor substrate 1, the insulating film, and the second gate electrode 3 constitute a second gate region.

When an appropriate voltage is applied to the first gate electrode 2, a p-channel is formed in the surface area of the first gate region for the flow of holes which are minor carriers. When an appropriate voltage is applied to the second gate electrode 3, the entire portion of the semiconductor substrate 1 located under the second gate electrode 3 as well as the surface area of the second gate region form a p-channel. Under the above conditions, when a voltage $V_D$ is applied to the semiconductor substrate 1 and a voltage $V_S$ is applied to the semiconductor region 5, a channel for flowing holes is formed between the semiconductor substrate 1 and the semiconductor region 5. A current thus flows through this channel as shown by a solid-line arrow in FIG. 14B.

With the above configuration, a light energy hv incident via the first gate electrode 2 causes pairs of electrons and holes to be generated in the portions of the well 4 and the semiconductor substrate 1 located under the first gate electrode 2 by photoelectric conversion. The holes flow into the semiconductor region, while the electrons are accumulated in a potential well formed in the middle of the well 4 as signal charge. The electrons used as the signal charge are major carriers in the well 4. The potential at the well 4 and thus the potential at the surface area of the first gate region change depending on the amount of the accumulated signal charge.

Consequently, the current flowing between the semiconductor substrate 1 and the semiconductor region 5 changes depending on the amount of the accumulated signal charge. Thus, by keeping a predetermined current flow between the semiconductor substrate 1 and the semiconductor region 5, the potential between the semiconductor substrate 1 and the semiconductor region 5 changes depending on the amount of accumulated signal charge. By keeping a predetermined potential between the semiconductor substrate 1 and the semiconductor region 5, however, the current flowing between the semiconductor substrate 1 and the semiconductor region 5 changes depending on the amount of accumulated signal charge. In this way, a first active element is formed between the semiconductor substrate 1 and the semiconductor region 5 having a channel composed of the surface areas of the first gate region and the second gate region. The electric characteristics of this active element change depending on the amount of accumulated signal charge.

A reset drain region 10 is also formed at the surface area of the semiconductor substrate 1 so that the surface thereof is on the same level as the principal surface 11. The reset drain region 10 is in contact with the surface area of the second gate region on the side opposite to the first gate region. An appropriate voltage is applied to the second gate electrode 3 to lower the potential barrier in the surface area of the second gate region. Then, the signal charge accumulated in the well 4 flows into the reset drain region 10 via a route shown by a dotted-line arrow in FIG. 14B. In this way, a second active element is formed between the well 4 and the reset drain region 10 having a channel composed of the surface area of the second gate region, realizing the drainage of the signal charge.

A plurality of amplification type solid-state imaging elements as shown in FIG. 14B are arranged in a matrix as shown in FIG. 14A. Rows of the first gate electrodes 2 aligned in the horizontal direction are commonly connected to respective clock lines VGA(i), VGA(i+1), . . . . Likewise, rows of the second gate electrodes 3 aligned in the horizontal direction are commonly connected to respective clock lines VGB(i), VGB(i+1), . . . .

The semiconductor region 5 which serves as a source is formed in the center of the first gate region of the well 4 of each amplification type solid-state imaging element. Columns of the semiconductor regions 5 aligned in the vertical direction are commonly connected to respective signal lines VS(j), VS(j+1), . . . . The semiconductor substrate 1 itself is used as the drain of each transistor, which is therefore not shown in FIG. 14A.

FIG. 15 is a schematic view in combination of an equivalent circuit diagram and a block diagram illustrating a configuration of an amplification type solid-state imaging device using the amplification type solid-state imaging elements of the TGMIS type shown in FIGS. 11A and 11B.

Referring to FIG. 15, amplification type solid-state imaging elements (pixels) 11-11, 11-12, . . . 11-1n, 11-21, . . . , 11-mn are arranged in a horizontal (X) direction and a vertical (Y) direction to form a matrix. Terminals of the first gate electrodes 2 of rows of the amplification type solid-state imaging elements aligned in the X direction are connected to a first vertical scanning circuit 13 via respective first scanning lines 12-1, 12-2, . . . . 12-m. Terminals of the second gate electrodes 3 of rows of the amplification type solid-state imaging elements aligned in the X direction are connected to a second vertical scanning circuit 15 via respective second scanning lines 14-1, 14-2, . . . . 14-m. The signal read operation and the reset operation are conducted for each horizontal row of pixels by sequentially selecting each horizontal row of pixels via the first and second vertical scanning circuits 13 and 15.

Terminals of source regions 5 of columns of the amplification type solid-state imaging elements aligned in the Y direction are connected to respective column lines 16-1, 16-2, . . . , 16-n. The column lines 16-1, 16-2, . . . , 16-n are commonly connected to a video line 18 via respective column selective transistors 17-1, 17-2, . . . 17-n. The video line 18 is grounded via a fixed current source load 19 while being connected to a signal output terminal 20. Control terminals of the column selective transistors 17-1, 17-2, . . . . 17-n are connected to a horizontal scanning circuit 21 so that the respective column selective transistors 17-1, 17-2, . . . , 17-n are sequentially selected and driven based on a control signal sent from the horizontal scanning circuit 21. The drain regions 6 of the amplification type solid-state imaging elements 11-11 to 11-mn are commonly connected, and a predetermined voltage is applied to the drain regions 6.

Thus, the above amplification type solid-state imaging device adopts a source/gate selection method, where columns of the pixels 11-11 to 11-mn are sequentially selected for each selection of a row of the pixels, and output signals of the respective selected pixels are sequentially read from the signal output terminal 20 via the video line 18.

The operation of the above solid-state imaging device will be described with reference to FIG. 16.

FIG. 16 is a timing chart showing the waveforms of signals used in the amplification type solid-state imaging device. The first vertical scanning circuit 13 outputs a first scanning pulse $\phi GI_i$ to an i-th first scanning line 12-i. The second vertical scanning circuit 15 outputs a second scanning pulse $\phi GII_i$ to an i-th second scanning line 14-i. The horizontal scanning circuit 21 outputs a signal read control pulse $\phi S_j$ to a j-th column line 16-j.

First, the first vertical scanning circuit 13 sequentially outputs first scanning pulses $\phi GI_1, \phi GI_2, \ldots, \phi GI_m$ of a low level VG(L) or a high level VG(H) in this order to the first gate electrodes 2 of the respective horizontal rows of pixels via the corresponding first scanning lines 12-1, 12-2, ..., 12-m. Simultaneously, the second vertical scanning circuit 15 sequentially outputs second scanning pulses $\phi GII_1$, $\phi GII_2$, ..., $\phi GII_m$ of a low level VRG(L) or a high level VRG(H) in this order to the second gate electrodes 3 of the respective horizontal rows of pixels via the corresponding second scanning lines 14-1, 14-2, ..., 14-m. At this time, the combination of the VG(H) of the first scanning pulse $\phi GI_i$ and the VRG(H) of the second scanning pulse $\phi GII_i$ is set in a signal read scanning period $\tau H$ for an i-th horizontal row of pixels. The combination of the VG(H) of a first scanning pulse $\phi GI_{(i+1)}$ and the VRG(L) of a second scanning pulse $\phi GII_{(i+1)}$ is set in a blanking period $\tau BL$ which starts from the end of the scanning of the i-th horizontal row of pixels and ends at the start of the scanning of the next (i+1)th row of pixels.

During the signal read scanning period $\tau H$ for the i-th row of pixels, the column selective transistors 17-1, 17-2, ..., 17-n are sequentially turned on with the signal read control pulses $\phi S_1$, $\phi S_2$, ..., $\phi S_n$ output from the horizontal scanning circuit 21. With this sequential activation of the column selective transistors, pixel signals which have been read from the amplification type solid-state imaging elements onto the corresponding column lines 16-1, 16-2, ..., 16-n are sequentially read onto the video line 18. The signal read control pulses $\phi S_1$, $\phi S_2$, ..., $\phi S_n$ as the horizontal scanning signals supplied to the gate terminals of the column selective transistors 17-1, 17-2, ..., 17-n are signals for sequentially selecting the column lines. The voltage values of these signals are set so that, when the signal level is low, a transistor among the column selective transistors 17-1, 17-2, ..., 17-n which has received the low-level voltage is turned off, while, when the signal level is high, a transistor which has received the high-level voltage is turned on.

The i-th horizontal row of the amplification type solid-sate imaging elements are all reset at a time when the first scanning pulse $\phi GI_i$ becomes the high level VG(H) and the second scanning pulse $\phi GII_i$ becomes the low level VRG(L). This reset operation is conducted during the blanking period $\tau BL$.

In this way, pixel signals are sequentially read from each horizontal row of pixels to obtain a field of video signals, and then reset.

Hereinbelow, the signal read operation and the reset operation for the first horizontal row of pixels will be described as an example.

Referring to FIG. 16, when the first scanning pulse $\phi GI_1$ output from the first vertical scanning circuit 13 becomes the high level VG(H) and the second scanning pulse $\phi GII_1$ output from the second vertical scanning circuit 15 becomes the high level VRG(H), the first row of the amplification type solid-state imaging devices 11-11, 11-12, ..., 11-1n connected to the first scanning line 12-1 and the second scanning line 14-1 are selected to allow the pixel signals of the first row of the pixels to be read onto the column lines 16-1, 16-2, ..., 16-n. As the column selective transistors 17-1, 17-2, ..., 17-n are sequentially turned on in this order with the signal read control pulses $\phi S_1$, $\phi S_2$, ..., $\phi S_n$ output from the horizontal scanning circuit 21, the pixel signals on the column lines 16-1, 16-2, ..., 16-n are sequentially output from the signal output terminal 20 of the video line 18 via the column selective transistors 17-1, 17-2, ..., 17-n. The first row of the amplification type solid-state imaging elements are then all reset at a time when the first scanning pulse $\phi GI_1$ keeps the high level VG(H) and the second scanning pulse $\phi GII_1$ becomes the low level VRG(L). The above signal read operation and the reset operation are repeated for the second and subsequent rows of pixels until one field of video signals are obtained.

According to the above amplification type solid-state imaging device, a potential change corresponding to the amount of signal charge generated by photoelectric conversion in the region under the first gate electrode 2 of each amplification type solid-state imaging element is read onto the corresponding column line 16 as a source potential. The source potential is kept unchanged and fixed as a pixel signal by charging parasitic capacitances on the column line 16 and the video line 18 by the fixed current source load 19, and output to the video line 18 via the corresponding column selective transistor 17. Since the capacitance of each amplification type solid-state imaging element is small, in order to output the exact potential at the region under the first gate electrode 2 to the column line 16 as a pixel signal, the current supplied from the constant current source load 19 should be as small as about 100 nA or less. In other words, if the current supplied from the constant current source load 19 is large, the parasitic capacitances on the column line 16 and the video line 18 are sufficiently charged, preventing delay in signal readout. However, this increases the potential at the region under the first gate electrode 2, preventing the exact potential from being output onto the column line 16 as a pixel signal. Conversely, if the current supplied from the constant current source load 19 is too small, the parasitic capacitances on the column line 16 and the video line 18 are not sufficiently charged. This dulls the signal waveform by the time constant of the parasitic capacitances, causing delay in signal readout.

In the above amplification type solid-state imaging device, only the constant current source load 19 connected to the video line 18 is provided to cover all the amplification type solid-state imaging elements formed in a matrix. This is insufficient in supplying charge to the parasitic capacitances of all the column lines 16 and the video line 18, degrading the video signal read response. Moreover, if an electric circuit is intended to be connected downstream of the video line 18, it is less likely for the video signals obtained from the amplification type solid-state imaging elements to be output at high speed.

The amplification type solid-state imaging device using the amplification type solid-state imaging elements of the TGMIS type was described hereinbefore. The same problems as those described above also arise when the solid-state imaging elements of the surface reset type, the trench type, and the BDMIS type are used instead of the TGMIS type.

SUMMARY OF THE INVENTION

The amplification type solid-state imaging device of this invention includes amplification type photoelectric converting elements arranged in a matrix. Each of the amplification type photoelectric converting elements includes: a transistor formed at a surface of a semiconductor substrate, for accumulating signal charge generated from incident light on a portion of the transistor at the surface of the semiconductor substrate and outputting an output signal comprising a change in an electric signal corresponding to the accumulated signal charge; a gate region formed adjacent to the transistor, including a portion of the semiconductor substrate, an insulating film formed on the portion of the semiconductor substrate, and a gate electrode formed on the insulating film, the gate region allowing the accumulated signal charge to move from the surface of the semiconductor substrate to the inside of the semiconductor substrate; and an output impedance converting section connected to the photoelectric converting elements which sequentially receives the output signals from the amplification type photoelectric converting elements, the output impedance converting section including a driving transistor driven with the output signals and a load transistor.

Alternatively, the amplification type solid-state imaging device of this invention includes amplification type photoelectric converting elements arranged in a matrix. Each of the amplification type photoelectric converting elements includes: a transistor, including a first gate region having a surface portion of a semiconductor substrate where signal charge generated byphotoelectric conversion is accumulated so as to output an output signal corresponding to the signal charge and a first gate electrode formed on the first gate region surface portion of the semiconductor substrate, a source, and a drain, each of the source and the drain being formed in a surface area of the semiconductor substrate and comprising an impurity layer with a higher impurity concentration than the impurity concentration of the semiconductor substrate; a charge draining section, including a second gate region having a surface portion of the semiconductor substrate adjacent to the first gate region and a second gate electrode formed on the second gate region surface portion of the semiconductor substrate via an insulating film so that a portion of the second gate electrode is adjacent to the first gate electrode, and a drain for charge draining formed in a surface area of the semiconductor substrate, wherein the drain is separated from the portions where the first gate electrode and the second gate electrode are formed adjacent to each other in a direction along the surface of the semiconductor substrate by a predetermined distance, the drain being made of an impurity layer with a higher impurity concentration than the impurity concentration of the semiconductor substrate, the accumulated signal charge being drained to the drain for charge draining of the charge draining section; and an output impedance converting section connected to the photoelectric converting elements which sequentially receives the output signals from the amplification type photoelectric converting elements, the output impedance converting section including a driving transistor driven with the output signals and a load transistor.

Alternatively, the amplification type solid-state imaging device of this invention includes a pixel portion including amplification type photoelectric converting elements arranged in a matrix. Each of the amplification type photoelectric converting elements includes: a transistor including a first gate region having a surface portion of a semiconductor substrate where signal charge generated by photoelectric conversion is accumulated so as to output an output signal corresponding to the signal charge and a first gate electrode formed on the first gate surface portion of the semiconductor substrate, a source, and a drain, each of the source and the drain being formed in a surface area of the semiconductor substrate and made of an impurity layer with a higher impurity concentration than the impurity concentration of the semiconductor substrate; a charge draining section including a second gate region having a surface portion of the semiconductor substrate adjacent to the first gate region and a second gate electrode formed on the second gate surface portion of the semiconductor substrate via an insulating film so that a portion of the second gate electrode is adjacent to the first gate electrode, the signal charge accumulated in the first gate region being drained to the semiconductor substrate via the second gate region; an electric field blocking section formed on at least a portion between the charge draining section of a particular photoelectric converting element and the transistor of a photoelectric converting element adjacent to the particular photoelectric converting element; and an output impedance converting section connected to the photoelectric converting elements which sequentially receives the output signals from the amplification type photoelectric converting elements, the output impedance converting section including a driving transistor driven with the output signals and a load transistor.

Alternatively, the amplification type solid-state imaging device of this invention includes amplification type photoelectric converting elements arranged in a matrix. Each of the amplification type photoelectric converting elements includes: a semiconductor region formed in a surface area of a semiconductor substrate; a first gate region including a first surface portion of the semiconductor substrate where signal charge generated by photoelectric conversion is accumulated and a first gate electrode formed on the surface portion of the semiconductor substrate; a second gate region including a second surface portion of the semiconductor substrate adjacent to the first gate region and a second gate electrode formed on the second surface portion via an insulating film; an active element formed between the semiconductor region and the semiconductor substrate with the surface portion of the first gate region as a channel so that a change in characteristics of the active element caused by the signal charge is used as an output signal; and an output impedance converting section connected to the photoelectric converting elements which sequentially receives the output signal from the amplification type photoelectric converting elements, the output impedance converting section including a driving transistor driven with the output signals and a load transistor.

In one embodiment of the invention, the amplification type solid-state imaging device further includes a constant current load section disposed for each signal line which is connected to the output impedance converting section and to which a plurality of amplification type photoelectric converting elements aligned in one direction are connected.

In another embodiment of the invention, the amplification type solid-state imaging device further includes a scanning section which allows the respective amplification type photoelectric converting elements to output the output signals and the output signals to be sequentially guided to the output impedance converting section, wherein a threshold voltage of the driving transistor of the output impedance converting section is smaller than a threshold voltage of a transistor used for the scanning section.

In still another embodiment of the invention, the driving transistor of the output impedance converting section is of a depletion type.

Thus, according to the amplification type solid-state imaging device of the present invention, the output impedance converting section including the driving transistor and the load transistor is connected to the video line which sequentially receives electric signals output from the respective amplification type solid-state imaging elements. The driving transistor is driven with the electric signals sequentially received by the video line. This placement of the output impedance converting section significantly reduces the output impedance. Accordingly, even if an electric circuit is connected to the output terminal of the output impedance converting section, the influence of the parasitic capacitances on the video line and the signal lines on the resultant pixel signals can be suppressed. As a result, the pixel signals are not dulled and can be output at high speed.

With the constant current source load sections provided on the respective signal lines, charge to be supplied to the parasitic capacitances can be secured for the individual signal lines. Thus, correct video signals can be obtained even at high-speed driving.

The threshold voltage of the driving transistor of the output impedance converting section is made smaller than the threshold voltage of the transistors constituting the scanning circuits for driving the amplification type solid-state imaging device. Alternatively, a depletion type transistor may be used as the driving transistor. In both cases, the source voltages obtained by the source/gate selection method can be output more correctly.

Thus, the invention described herein makes possible the advantage of providing an amplification type solid-state imaging device where a larger number of pixels are arranged with a higher density, a high S/N ratio can be obtained, and high-speed signal readout is realized.

These and other advantages of the present invention will become apparent to those skilled in the art upon reading and understanding the following detailed description with reference to the accompanying figures.

BRIEF DESCRIPTION OF THE DRAWINGS

FIG. 8 is a schematic view in combination of an equivalent circuit diagram and a block diagram of an amplification type solid-state imaging device of Example 6 according to the present invention.

FIG. 9 is a schematic view in combination of an equivalent circuit diagram and a block diagram of an alternative amplification type solid-state imaging device of Example 6 according to the present invention.

FIG. 10 is a schematic view in combination of an equivalent circuit diagram and a block diagram of another alternative amplification type solid-state imaging device of Example 6 according to the present invention.

FIG. 15 is a schematic view in combination of an equivalent circuit diagram and a block diagram of an amplification type solid-state imaging device using the amplification type solid-state imaging elements of FIGS. 11A and 11B.

DESCRIPTION OF THE PREFERRED EMBODIMENTS

The present invention will be described by way of examples with reference to the accompanying drawings.

(EXAMPLE 1)

Figure 1:
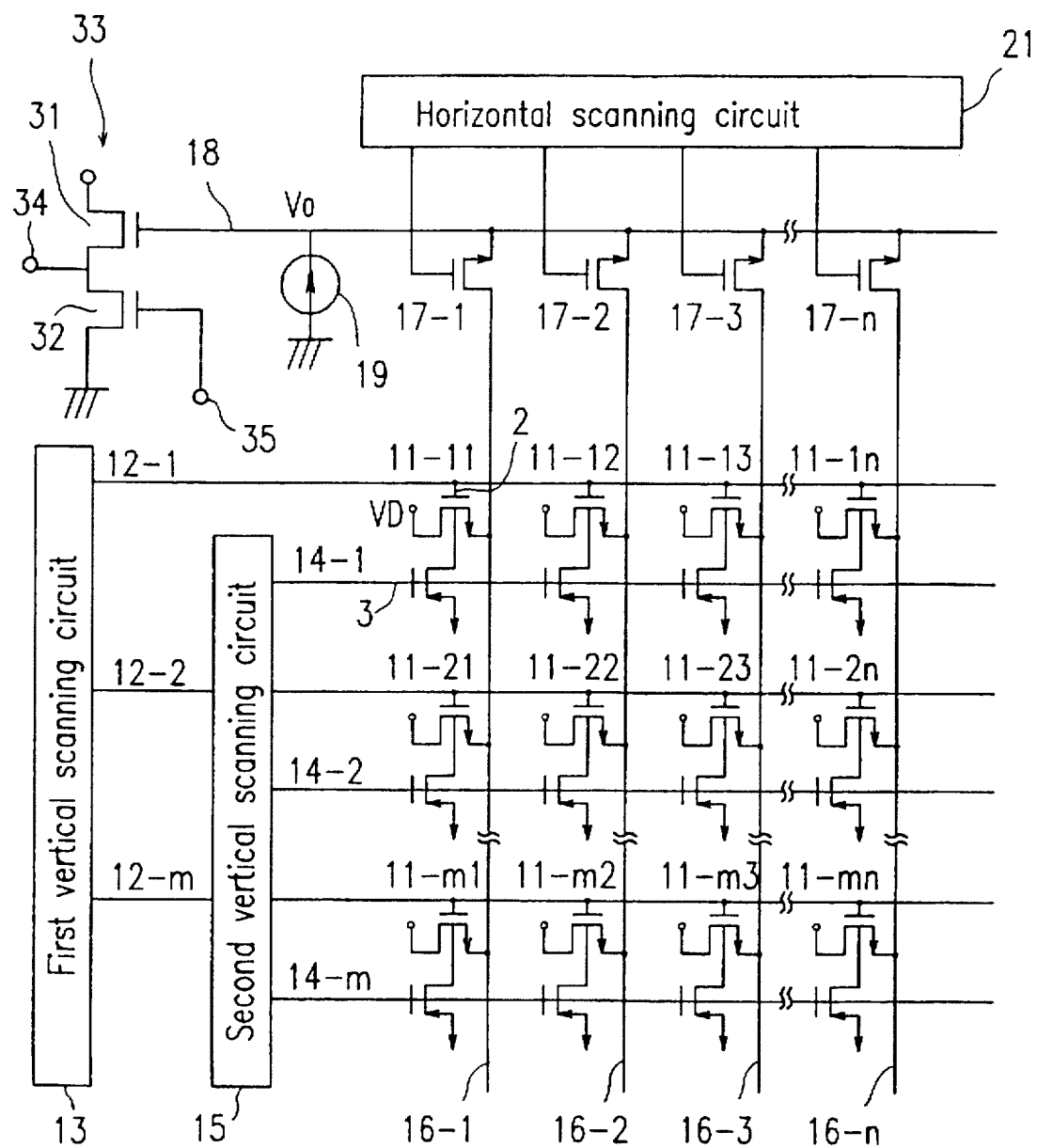
FIG. 1 is a schematic view in combination of an equivalent circuit diagram and a block diagram of an amplification type solid-state imaging device of Examples 1, 4, and 5 according to the present invention.
Figure 11A:
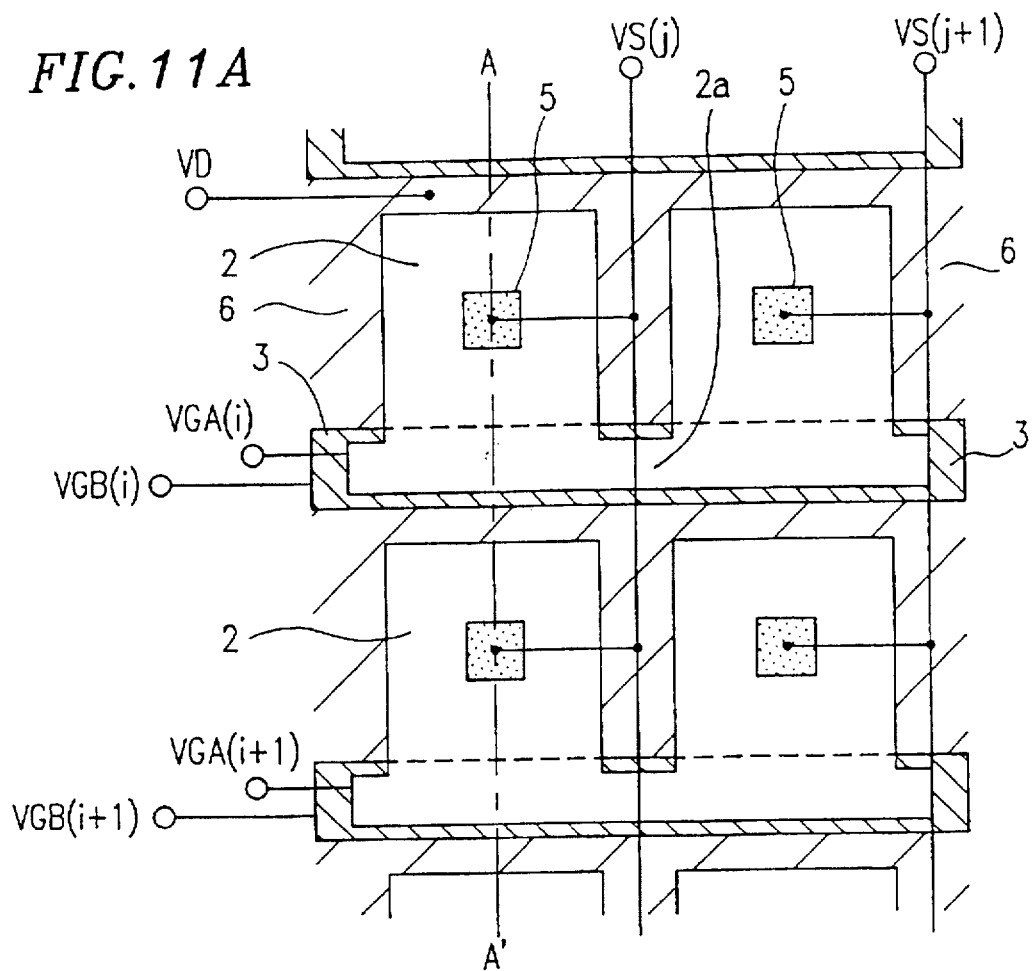
FIG. 11A is a plan view of amplification type solid-state imaging elements of the TGMIS type constituting an amplification type solid-state imaging device.
Figure 11B:
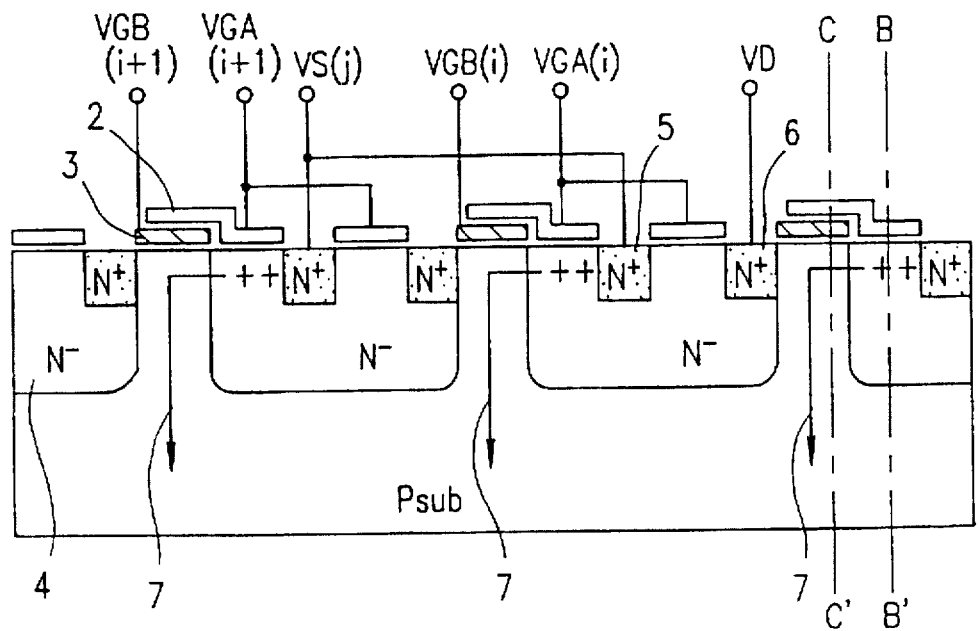
FIG. 11B is a sectional view taken along line A-A' of FIG. 11A.

FIG. 1 is a schematic view in combination of an equivalent circuit diagram and a block diagram of an amplification type solid-state imaging device of Example 1 according to the present invention. The amplification type solid-state imaging device of this example uses the amplification type solid-state imaging elements shown in FIGS. 11A and 11B. The components having the same functions and effects as those shown in FIG. 15 are denoted by the same reference numerals, and the description thereof is omitted.

Referring to FIG. 1, an output impedance converting section (source follower circuit) 33 composed of a series circuit of a driving transistor 31 and a load transistor 32 is connected to the video line 18 which receives pixel signals as the video signals are read from the pixels (amplification type solid-state imaging elements) 11-11, 11-12, ..., 11-mn via the column lines 16-1, 16-2, ..., 16-n. The driving transistor 31 is driven with the pixel signals. A signal output terminal 34 is provided at the junction of the driving transistor 31 and the load transistor 32. A control terminal 35 is connected to a gate terminal of the load transistor 32 for controlling the current value.

The operation of the amplification type solid-state imaging device with the above configuration will be described.

Figure 2:
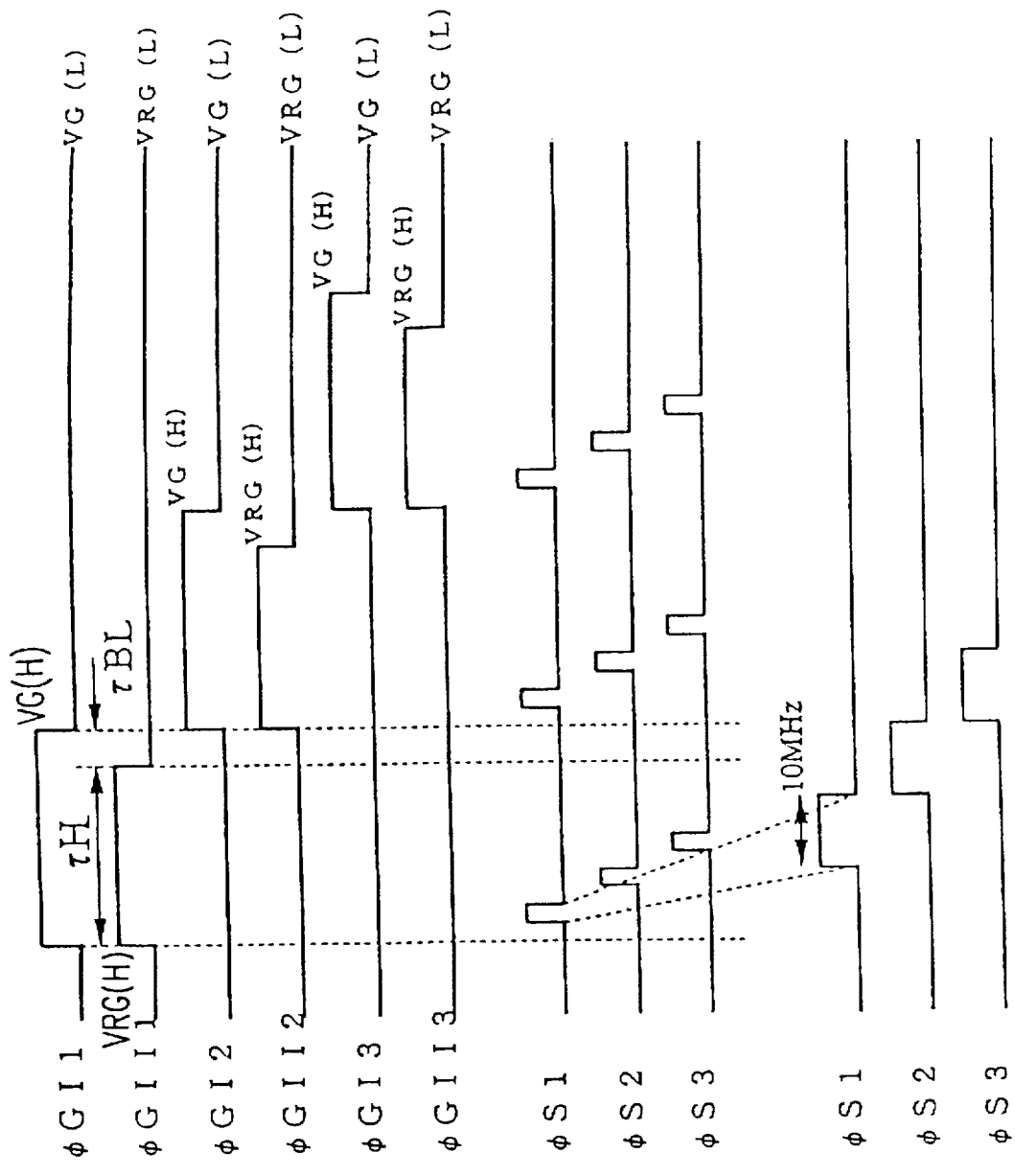
FIG. 2 is a timing chart showing signal waveforms for describing the operation of the amplification type solid-state imaging device of FIG. 1.

FIG. 2 is a timing chart showing the signal waveforms for describing the operation of the amplification type solid-state imaging device of this example. The first vertical scanning circuit 13 outputs the first scanning pulse $\phi GI_1$ to the i-th first scanning line 12-i. The second vertical scanning circuit 15 outputs the second scanning pulse $\phi GII_i$ to the i-th second scanning line 14-i. The horizontal scanning circuit 21 outputs the signal read control pulse $\phi S_j$ to the j-th column line 16-j.

First, as shown in FIG. 2, when the first scanning pulse $\phi GI_1$ output from the first vertical scanning circuit 13 to the first gate electrodes 2 of the first row of the amplification type solid-state imaging elements becomes the high level VG(H) and the second scanning pulse $\phi GII_1$ output from the second vertical scanning circuit 15 to the second gate electrodes 3 of the first row of the elements becomes the high level VRG(H), the first row of the elements 11-11, 11-12, . . . , 11-1n are selected via the first scanning line 12-1 and the second scanning line 14-1, allowing pixel signals of the first row of the elements to be read onto the column lines 16-1, 16-2, . . . , 16-n. As the column selective transistors 17-1, 17-2, . . . , 17-n are sequentially turned on with the signal read control pulses $\phi S_1, \phi S_2, \ldots, \phi S_n$ output from the horizontal scanning circuit 21, the pixel signals on the column lines 16-1, 16-2, . . . , 16-n are sequentially output to the video line 18 as the video signals.

The first row of the amplification type solid-state imaging elements are then all reset at a time when the first scanning pulse $\phi GI_1$ keeps the high level VG(H) and the second scanning pulse $\phi GII_1$ becomes the low level VRG(L). The pixel signals read on the column lines 16-1, 16-2, . . . , 16-n are reset.

Then, when the first scanning pulse $\phi GI_2$ output from the first vertical scanning circuit 13 to the first gate electrodes 2 of the second row of the amplification type solid-state imaging elements becomes the high level VG(H) and the second scanning pulse $\phi GII_2$ output from the second vertical scanning circuit 15 to the second gate electrodes 3 of the second row of the elements becomes the high level VRG(H), the second row of the elements 11-21, 11-22, . . . , 11-2n are selected via the first scanning line 12-2 and the second scanning line 14-2, allowing the pixel signals of the second row of the elements to be read onto the column lines 16-1, 16-2, . . . , 16-n. As the column selective transistors 17-1, 17-2, . . . , 17-n are sequentially turned on in this order with the signal read control pulses $\phi S_1, \phi S_2, \ldots, \phi S_n$ output from the horizontal scanning circuit 21, the pixel signals on the column lines 16-1, 16-2, . . . , 16-n are sequentially output to the video line 18 as the video signals.

The second row of amplification type solid-state imaging elements are then all reset at a time when the first scanning pulse $\phi_2$ keeps the high level VG(H) and the second scanning pulse $\phi GII_2$ becomes the low level VRG(L). The pixel signals read on the column lines 16-1, 16-2, . . . , 16-n are reset.

Likewise, the pixel signals are sequentially read to the video line 18 via the respective column lines 16-1, 16-2, . . . , 16-n, until one field (one screen) of video signals are obtained.

The pixel signals output to the video line 18 are then input into a gate terminal of the driving transistor 31 of the output impedance converting section 33, where output impedance conversion, i.e., current amplification is conducted. The resultant signals are output from the signal output terminal 34.

In the output impedance converting section 33, an NMOS transistor (L=3 µm, W=30 µm), for example, is used for the driving transistor 31 and an NMOS transistor (L=5 µm, W=100 µm), for example, is used for the load transistor 32. A predetermined voltage is applied to the gate terminal of the load transistor 32 so that the constant current amount at the load transistor 32 is about 1 mA.

Figure 3:
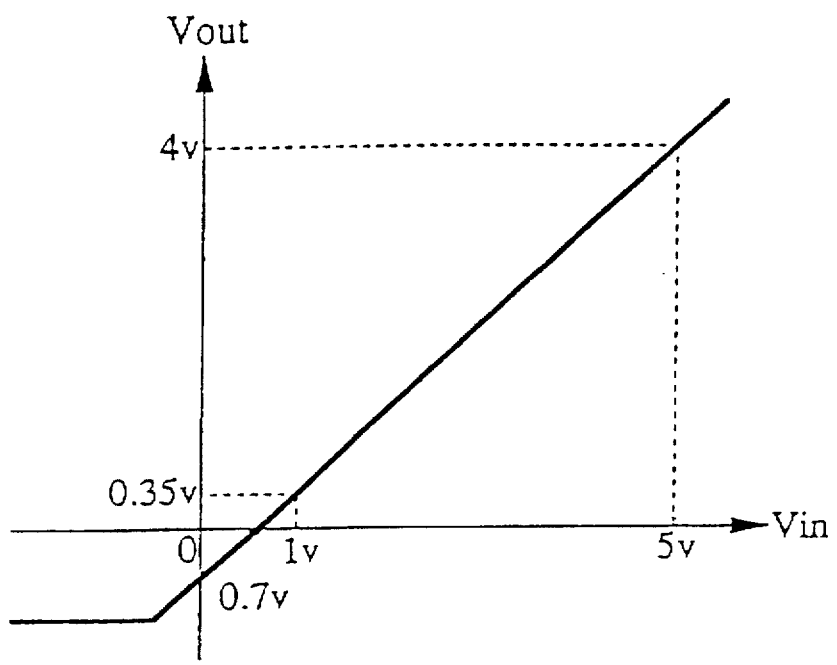
FIG. 3 is a graph showing the change in the voltage signal output from the amplification type solid-state imaging device according to the present invention, as well as the input/output voltage characteristic of an output impedance converting section.

FIG. 3 shows the change in the voltage signal output from the amplification type solid-state imaging device, as well as the input/output characteristic of the output impedance converting section 33, obtained when a predetermined voltage is applied to the gate terminal of the load transistor 32 so that the constant current amount at the load transistor 32 is about 1 mA. While the output impedance of the pixel signals was as high as about 7 kΩ at maximum before the output impedance conversion, it was reduced to about 400 Ω at maximum after the output impedance conversion by the output impedance converting section 33.

Now, the output waveforms of the pixel signals obtained on the video line 18 will be described with reference to FIGS. 4A and 4B.

Figure 4A:
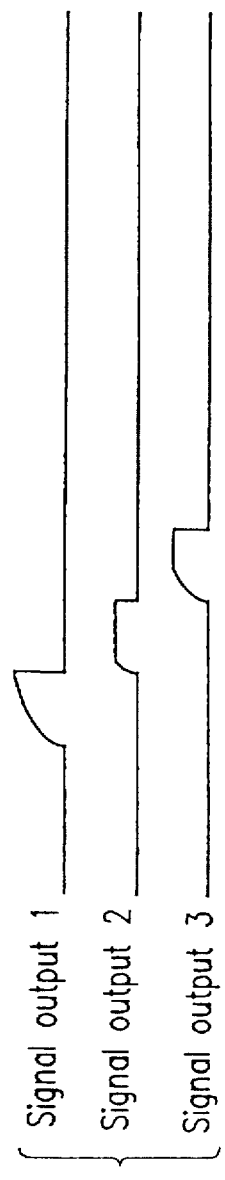
FIG. 4A shows the output waveforms of pixel signals when a video line of the amplification type solid-state imaging device is directly connected to an external electric circuit without using the output impedance converting section shown in FIG. 1.

FIG. 4A shows the output waveforms of the pixel signals obtained when the video line 18 is directly connected to an external electric circuit without providing the output impedance converting section 33 shown in FIG. 1. FIG. 4B shows the output waveforms of the pixel signals obtained when an electric circuit is connected downstream of the output impedance converting section 33.

Assume that the load capacitance of the connected electric circuit is several pFs at maximum and the driving frequency of the horizontal scanning circuit 21 is 10 MHz. The pixel signals output from the amplification type solid-state imaging elements are selectively output when the signal read control pulses $\phi S_1, \phi S_2,$ and $\phi S_3$ are in the high level V(H) as described above. When the amplification type solid-state imaging device is directly connected to an external electric circuit without the output impedance converting section, it takes longer rising time to obtain a desired output voltage of the pixel signal as shown in FIG. 4A. This is because, due to a large output impedance, sufficient charge cannot be supplied to an external load capacitance. This distorts the output waveform of the pixel signal, preventing correct and high-speed signal readout.

Figure 4B:
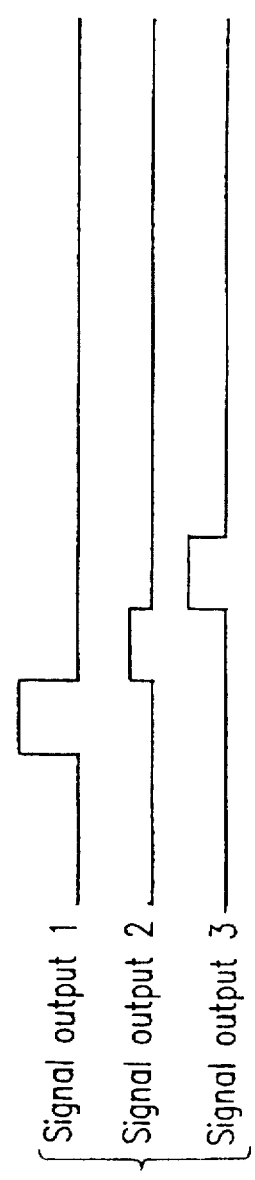
FIG. 4B shows the output waveforms of pixel signals when an electric circuit is connected downstream of the output impedance converting section.

On the contrary, when an electric circuit is connected downstream of the output impedance converting section 33, a desired correct output voltage of the pixel signal can be obtained at high speed without any trouble as shown in FIG. 4B as far as the driving frequency of the horizontal scanning circuit 21 is about 10 MHz at maximum. This is because, due to a small output impedance, sufficient charge can be supplied to an external load capacitance.

(EXAMPLE 2)

Figure 5:
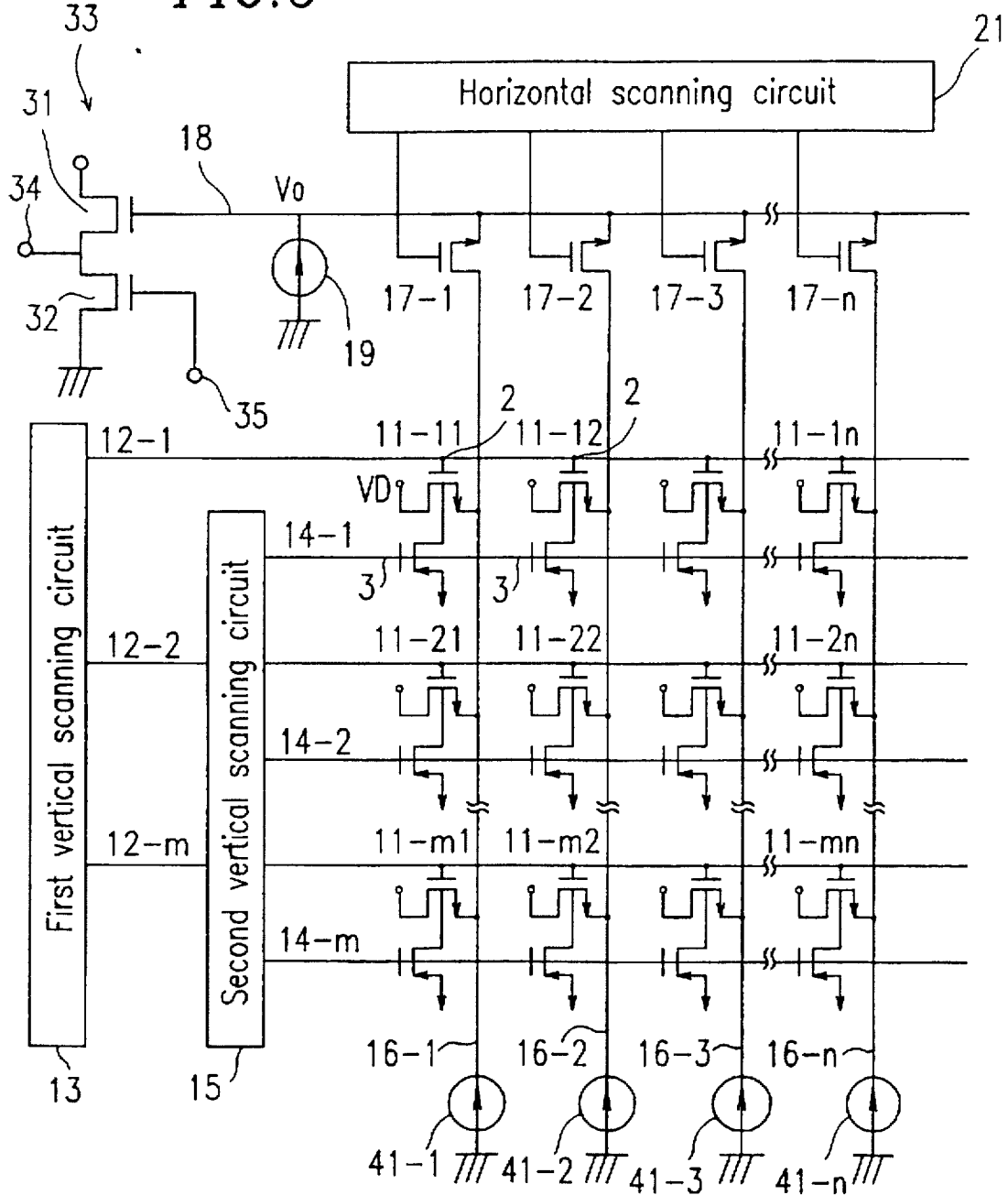
FIG. 5 is a schematic view in combination of an equivalent circuit diagram and a block diagram of an amplification type solid-state imaging device of Example 2 according to the present invention.

FIG. 5 is a schematic view in combination of an equivalent circuit and a block diagram of an amplification type solid-state imaging device of Example 2 according to the present invention. The amplification type solid-state imaging device of this example also uses the amplification type solid-state imaging elements shown in FIGS. 11A and 11B. The components having the same functions and effects as those shown in FIG. 15 are denoted by the same reference numerals, and the description thereof is omitted.

Referring to FIG. 5, constant current source load sections 41-1, 41-2, . . . , 41-n are provided for the respective column lines 16-1, 16-2, . . . , 16-n which are connected to the video line 18 via the respective column selective transistors 17-1, 17-2, . . . , 17-n and also connected to the respective columns of the amplification type solid-state imaging elements aligned in the vertical direction.

With the above configuration, pixel signals read onto the video line 18 are input into the gate terminal of the driving transistor 31 constituting the output impedance converting section (source follower circuit) 33 together with the load transistor 32. The output impedance converting section 33 performs output impedance conversion, i.e., current amplification and outputs the resultant signals from the signal output terminal 34 as the video signals. In this example, the constant current source load sections 41-1, 41-2, . . . , 41-n are provided on the respective column lines 16-1, 16-2, . . . , 16-n as sources of charge to be supplied to parasitic capacitances generated on the column lines 16-1, 16-2, . . .

16-n. With this configuration, since the charge supply to the parasitic capacitances improves, more correct and higher-speed signal readout can be effected at a high-speed operation than in Example 1.

(EXAMPLE 3)

Figure 6:
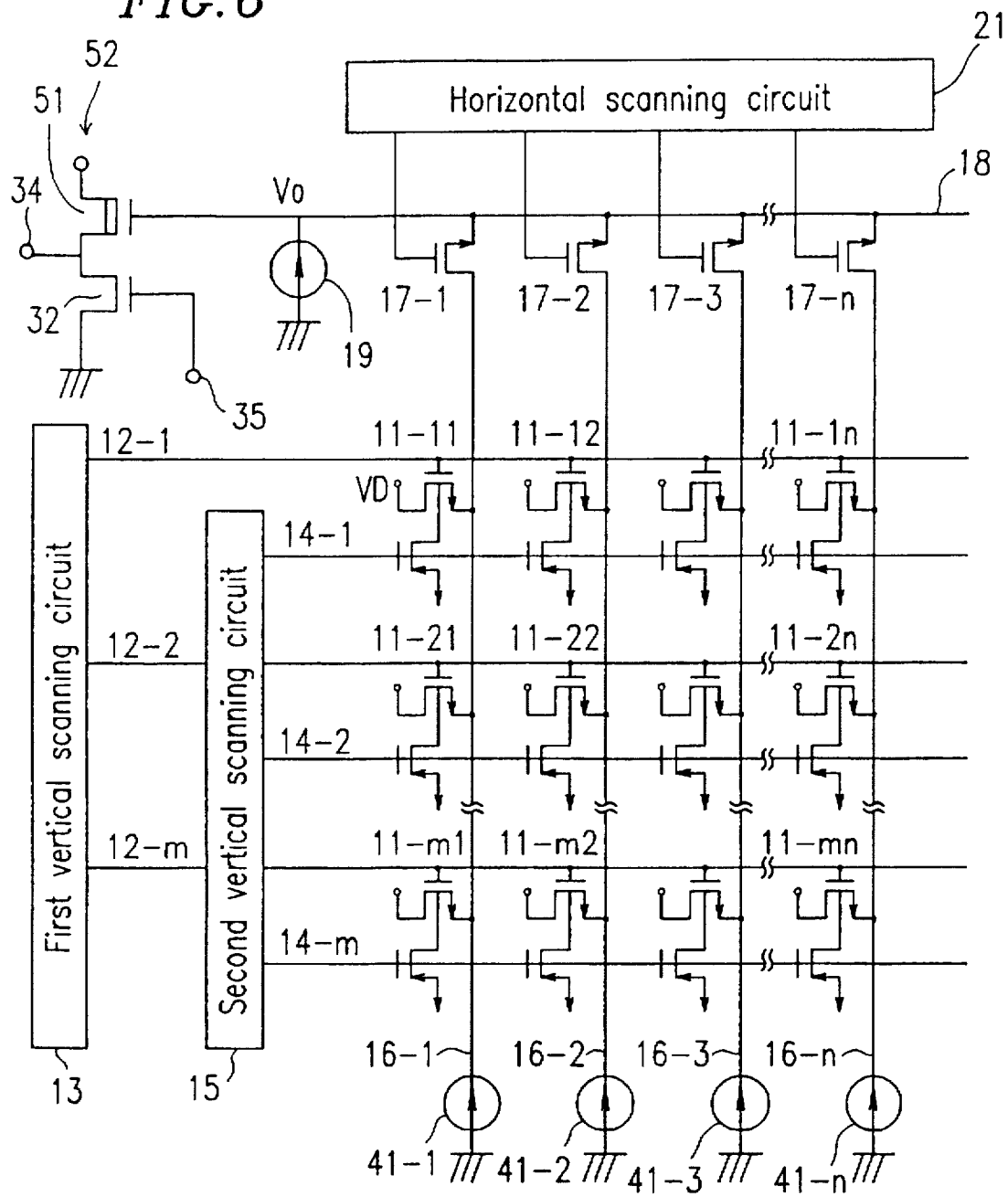
FIG. 6 is a schematic view in combination of an equivalent circuit diagram and a block diagram of an amplification type solid-state imaging device of Example 3 according to the present invention.

FIG. 6 is a schematic view in combination of an equivalent circuit and a block diagram of an amplification type solid-state imaging device of Example 3 according to the present invention. The amplification type solid-state imaging device of this example also uses the amplification type solid-state imaging elements shown in FIGS. 11A and 11B. The components having the same functions and effects as those shown in FIG. 15 are denoted by the same reference numerals, and the description thereof is omitted.

Referring to FIG. 6, an output impedance converting section 52 composed of a series circuit of a driving transistor 51 and the load transistor 32 is connected to the video line 18 which receives pixel signals as video signals read from the pixels (amplification type solid-state imaging elements) 11-11, 11-12, . . . , 11-mn via the respective column lines 16-1, 16-2, . . . , 16-n. The driving transistor 51 is driven with the pixel signals. The threshold voltage of the driving transistor 51 is made smaller than the threshold voltage of transistors used in the first vertical scanning circuit 13, the second vertical scanning circuit 15, and the horizontal scanning circuit 21. Alternatively, the driving transistor 51 may be of a depletion type.

With the above configuration, pixel signals read onto the video line 18 are input into the gate terminal of the driving transistor 51 constituting the output impedance converting section (source follower circuit) 52 together with the load transistor 32. The output impedance converting section 52 performs output impedance conversion, i.e., current amplification and outputs the resultant signals from the signal output terminal 34 as the video signals.

The output impedance converting section 52, with a constant current amount at the load transistor 32 of about 1 mA, allows for the current amplification while the variation in the voltage signals output from the amplification type solid-state imaging device is maintained. A voltage amplification gain α is about 0.8 at maximum though it depends on the constant current amount at the load transistor 32.

In Example 3, the dark-time output level and the saturation output level of the amplitude of the voltage signals output from the amplification type solid-state imaging elements can be set arbitrarily depending on the carrier concentration and depth of the well layer formed in the surface area of the semiconductor substrate located under the first gate electrode and the driving voltage.

Figure 7:
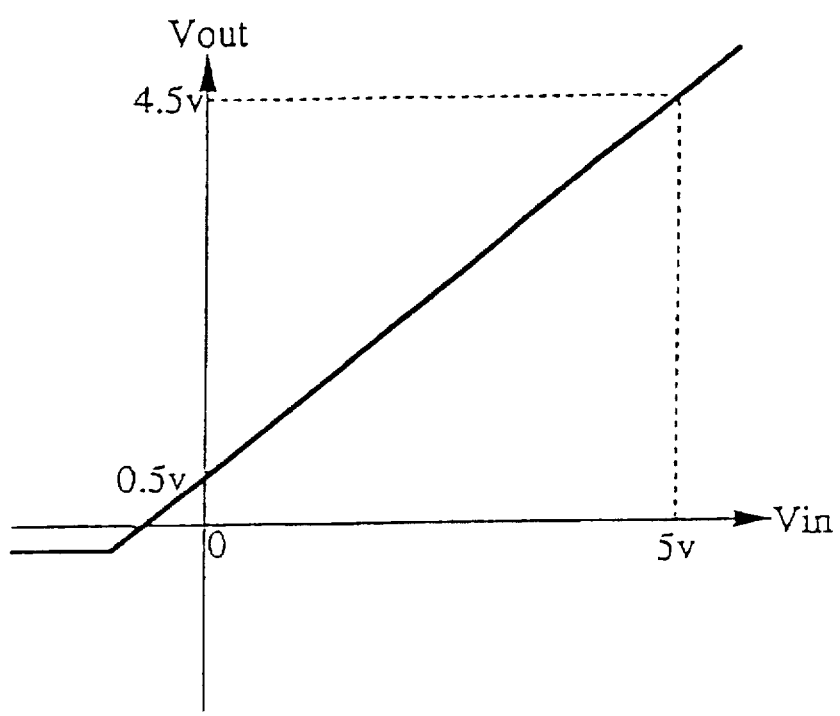
FIG. 7 is a graph obtained by shifting the input/output voltage characteristic shown in FIG. 3 to the left.

To realize the above, in general, the driving transistor 51 and the load transistor 32 constituting the output impedance converting section (source follower circuit) 52 may be formed together with the transistors constituting the scanning circuits of the amplification type solid-state imaging device in the same process. However, in order to secure a large dynamic range for the amplification type solid-state imaging device, the amplitude of the output signals can be optimized so as to be in the range of 0(V) at minimum to 5(V) at maximum. With an amplitude in this range, an input signal in the range of 0(V) to 1(V) is not reflected by the output signal according to the input/output voltage characteristic of the output impedance converting circuit shown in FIG. 3. The input/output voltage characteristic is defined by the threshold voltage and source-drain current value of the driving transistor 51 of the output impedance converting section 52. As for the transistors constituting the scanning circuits, the threshold voltage $V_{th}$ is designed so that $|V_{th}|$ is about 0.8(V) at maximum. Accordingly, the threshold of the driving transistor 51 may be made smaller than the threshold voltage of the transistors constituting all the scanning circuits of the amplification type solid-state imaging device, or the driving transistor 51 may be composed of a depletion type transistor. With this setting, the input/output voltage characteristics shown in FIG. 3 can be shifted to the left as shown in FIG. 7 so that the operation point corresponds to the amplitude of the voltage signals output from the amplification type solid-state imaging elements.

More specifically, when the amplitude of the voltage signals output from the amplification type solid-state imaging elements is 0 to 4.5 V and the constant current amount at the load transistor 32 of the output impedance converting section (source follower circuit) 52 is 1 mA, the voltage conversion gain α of the driving transistor 51 is 0.6 at maximum. By setting the threshold voltage $V_{th}$ of the driving transistor 51 at −0.7 V at maximum, the output impedance conversion is performed while the amplitude of the voltage signals output from the amplification type solid-state imaging elements can be correctly reflected.

Thus, the source voltage obtained by the source/gate selection method can be correctly output by setting the threshold voltage of the driving transistor 51 of the output impedance converting section (source follower circuit) 52 smaller than the threshold voltage of the transistors constituting all the scanning circuits of the amplification solid-state imaging device or by using a depletion-type transistor as the driving transistor 51.

As described above, the amplification type solid-state imaging devices of Examples 1 to 3 include the amplification type solid-state imaging elements arranged in a matrix, where photoelectric conversion is performed in the gate region of the MOS transistor formed on the semiconductor substrate, and a potential change in the MOS transistor corresponding to signal charge accumulated in the gate region is obtained as a sensor output. In such an amplification type solid-state imaging device, each MOS transistor formed on the semiconductor substrate is composed of the first gate region where photoelectric conversion is conducted, the source region, and the drain region. The second gate region is formed adjacent to the first gate region. The transistor accumulates signal charge generated by photoelectric conversion using light energy incident through the first gate region in the portion thereof located in the surface area of the semiconductor substrate, and outputs an electric signal corresponding to the accumulated signal charge. The device is provided with the reset function where the signal charge accumulated in the first gate region is moved to the middle portion of the semiconductor substrate via the second gate region adjacent to the transistor. The amplification type solid-state imaging device also includes the first and second vertical scanning circuits for synchronously driving the first gate region and the second gate region, respectively, and the horizontal scanning circuit for sequentially selecting the source regions connected to the column lines. A predetermined voltage is supplied to the drain regions. Pixel signals are read onto the video line by sequentially selecting the amplification type solid-state imaging elements by the vertical scanning circuits and the horizontal scanning circuit. The pixel signals read onto the video line are supplied to the output impedance converting section (source follower circuit) as the current amplification output section composed of a series circuit of the driving transistor and the load transistor, and output from the output terminal of the output impedance converting section (source follower circuit) as the video signals. With this configuration, even if an electric circuit is connected to the output terminal, the video signals obtained at the respective amplification type solid-state imaging elements can be output more correctly and at higher speed.

In Examples 1 to 3, MOSFETs are used as the transistors for the amplification type solid-state imaging elements. The same effects and functions can also be obtained by using junction gate type FETs and FETs provided with a control gate.

(EXAMPLE 4)

Figure 12A:
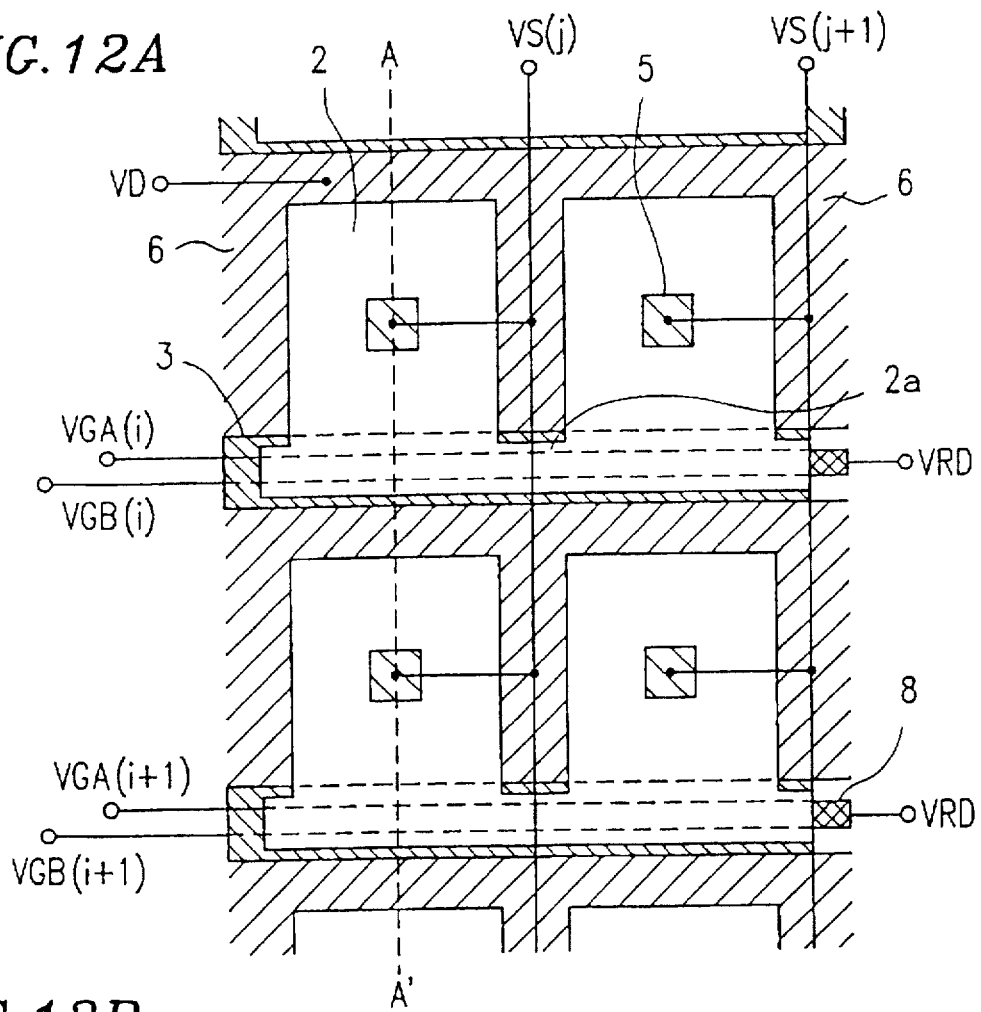
FIG. 12A is a plan view of amplification type solid-state imaging elements of the TGMIS surface reset type constituting an amplification type solid-state imaging device.
Figure 12B:
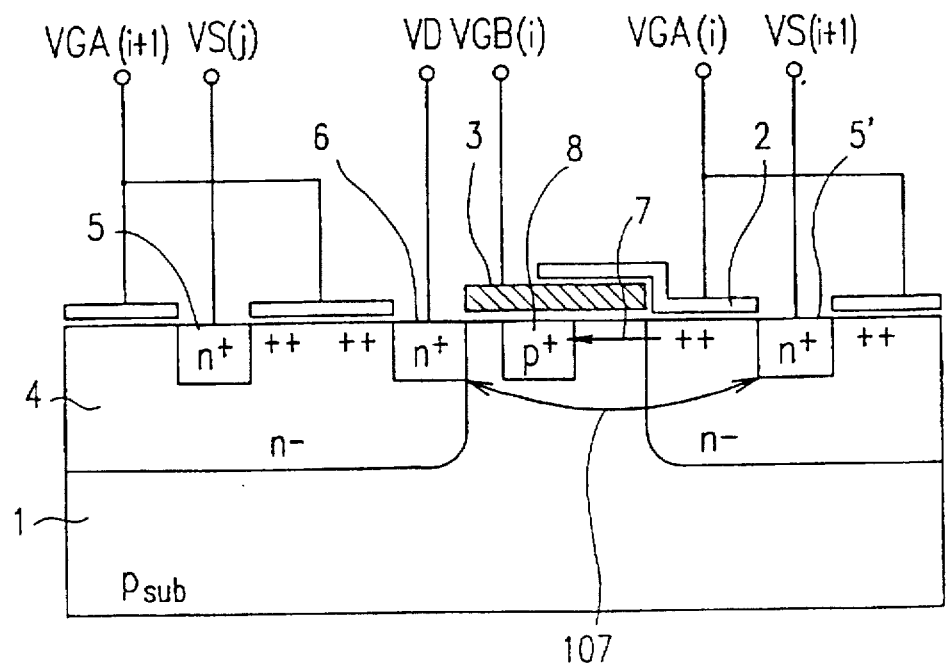
FIG. 12B is a sectional view taken along line A-A' of FIG. 12A.
Figure 13A:
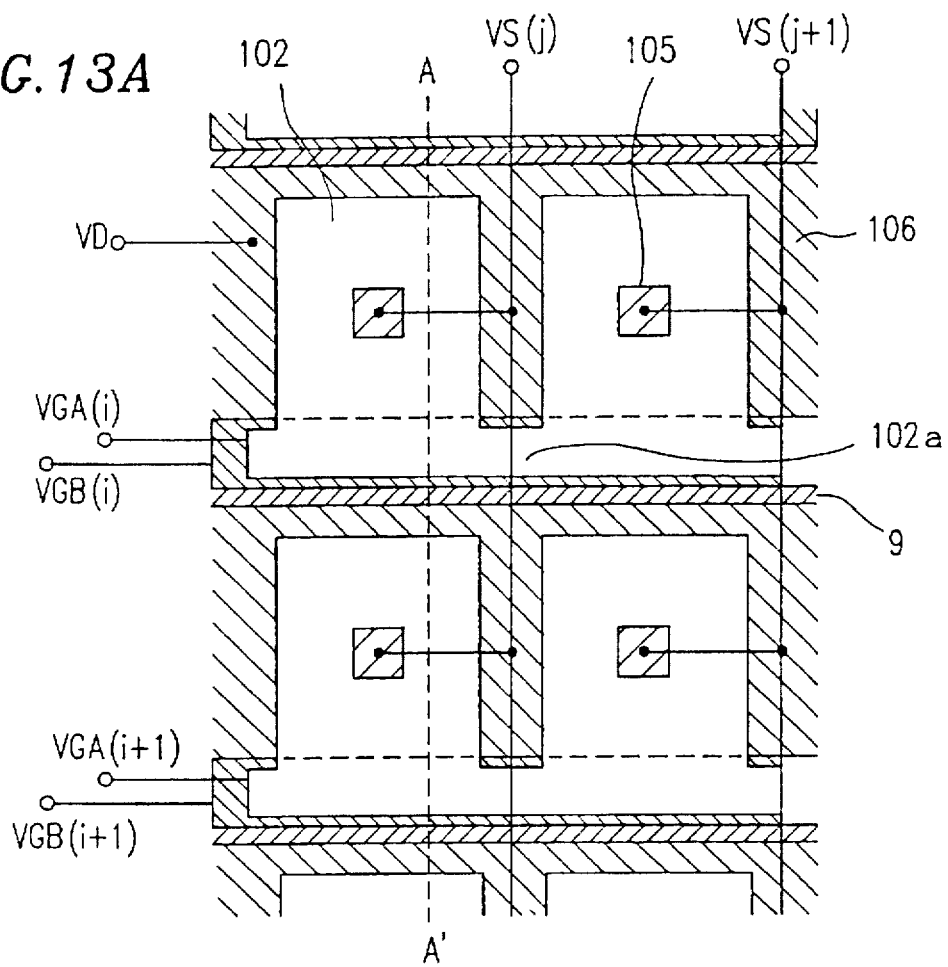
FIG. 13A is a plan view of amplification type solid-state imaging elements of the TGMIS trench type constituting an amplification type solid-state imaging device.
Figure 13B:
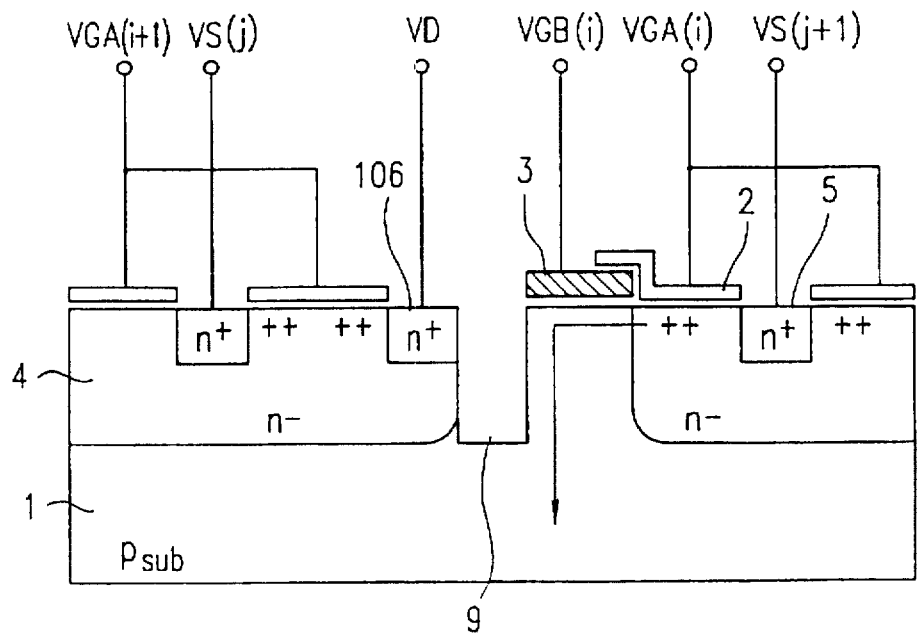
FIG. 13B is a sectional view taken along line A-A' of FIG. 13A.
Figure 14A:
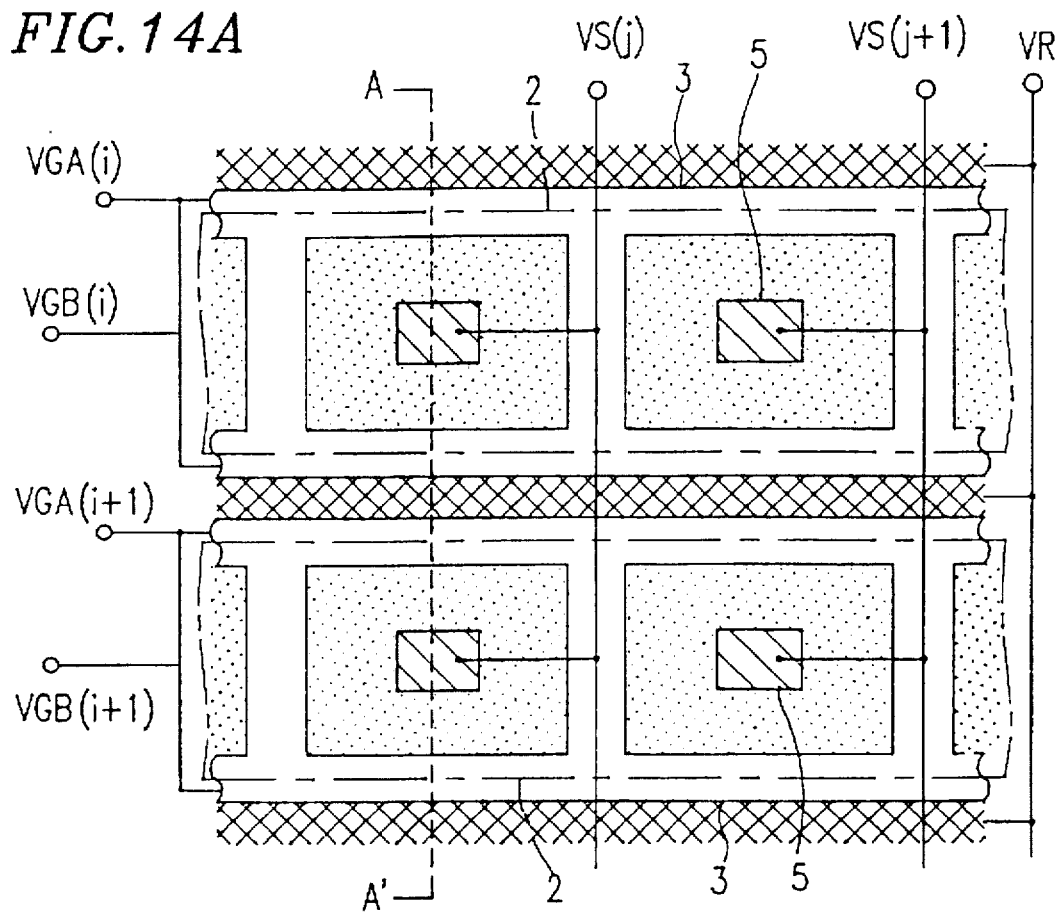
FIG. 14A is a plan view of amplification type solid-state imaging elements of the BDMIS type constituting an amplification type solid-state imaging device.
Figure 14B:
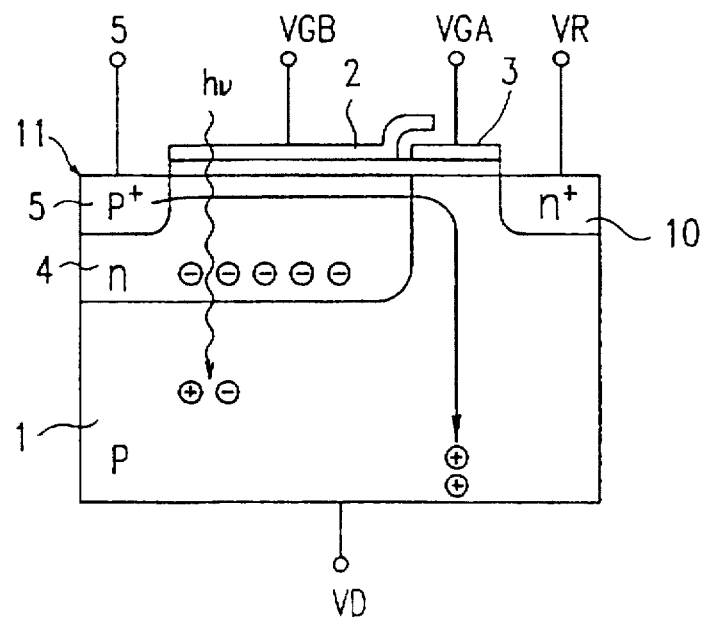
FIG. 14B is a partial sectional view taken along line A-A' of FIG. 14A.
Figure 16:
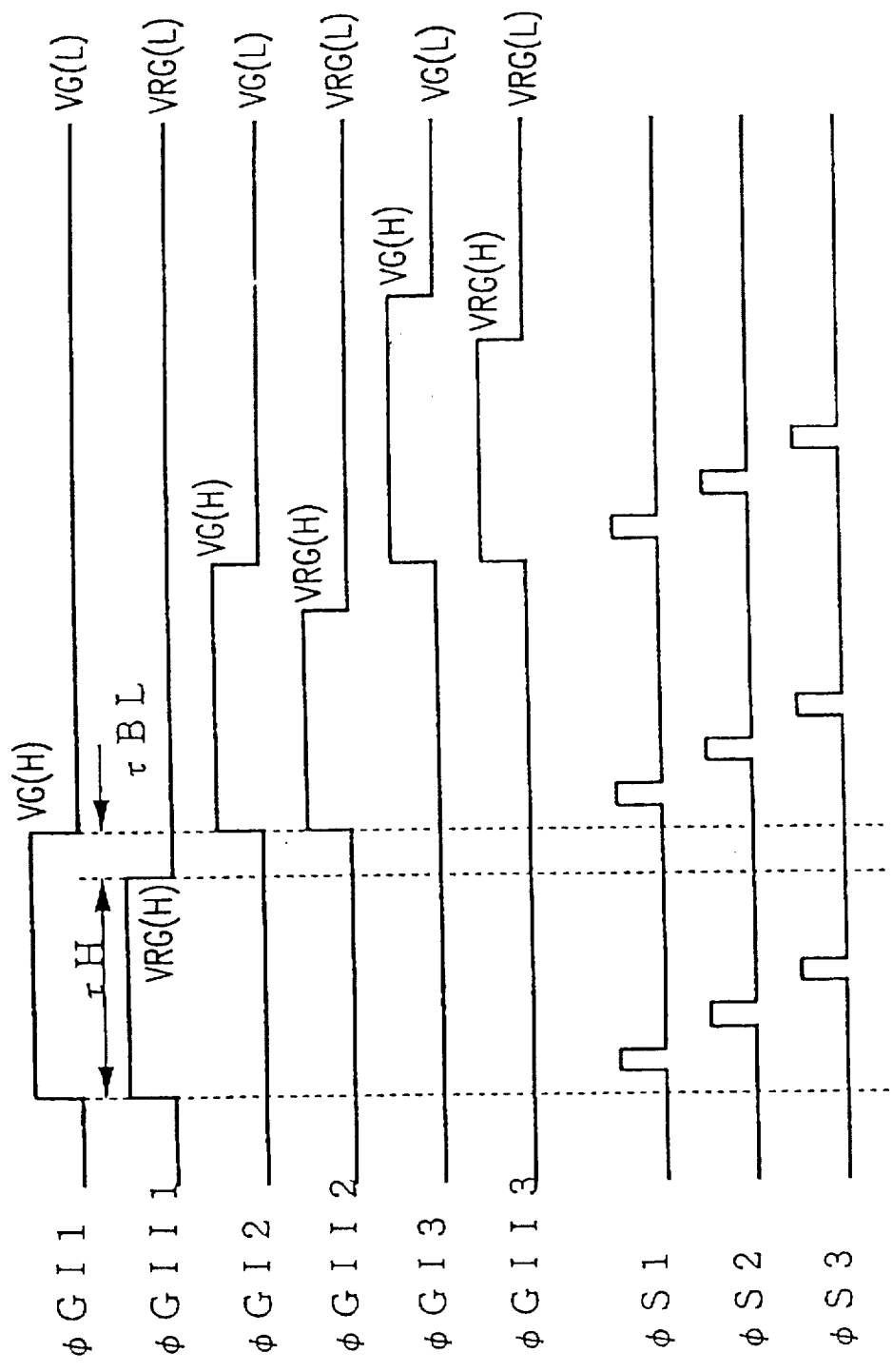
FIG. 16 is a timing chart showing signal waveforms for describing the operation of the amplification type solid-state imaging device of FIG. 15.

An amplification type solid-state imaging device of Example 4 will be described with reference to FIG. 1. In Example 4, unlike Examples 1 to 3 above, the surface reset type amplification type solid-state imaging elements shown in FIGS. 12A and 12B are used. Since the equivalent circuit of the TGMIS surface reset type used in Example 4 is the same as that of the TGMIS type used in Examples 1 to 3, the same figure as that used in Example 1 is used in this example.

As is expected from the fact that the equivalent circuit is the same as that in Example 1, the amplification type solid-state imaging device of Example 4 has the same effects as those described in Example 1.

In Example 4, the constant current load sections 41-1, 41-2, . . . , 41-n may be provided for the respective column lines 16-1, 16-2, . . . , 16-n as in Example 2.

Also, as in Example 3, the threshold voltage of the driving transistor 51 of the output impedance converting section may be made smaller than the threshold voltage of the transistors constituting the first vertical scanning circuit 13, the second vertical scanning circuit 15, and the horizontal scanning circuit 21. Alternatively, the driving transistor 51 may be of the depletion type.

With the above configurations, the same effects as those described in Examples 2 and 3 can be obtained.

(EXAMPLE 5)

An amplification type solid-state imaging device of Example 5 will be described with reference to FIG. 1. In Example 5, unlike Examples 1 to 3 above, the trench type amplification type solid-state imaging elements are used. Since the equivalent circuit of the TGMIS trench type used in Example 5 is the same as that of the TGMIS type used in the Examples 1 to 3, the same figure as that used in Example 1 is used in this example.

As is expected from the fact that the equivalent circuit is the same as that in Example 1, the amplification type solid-state imaging device of Example 5 has the same effects as those described in Example 1.

In Example 5, the constant current load sections 41-1, 41-2, . . . , 41-n can be provided for the respective column lines 16-1, 16-2, . . . , 16-n as in Example 2.

Also, as in Example 3, the threshold voltage of the driving transistor 51 of the output impedance converting section may be made smaller than the threshold voltage of the transistors constituting the first vertical scanning circuit 13, the second vertical scanning circuit 15, and the horizontal scanning circuit 21. Alternatively, the driving transistor 51 may be of the depletion type.

With the above configurations, the same effects as those described in Examples 2 and 3 can be obtained.

(EXAMPLE 6)

FIG. 8 shows an amplification type solid-state imaging device of Example 6 according to the present invention. In Example 6, unlike Examples 1 to 3 above, the BDMIS type amplification type solid-state imaging elements are used. The components having the same functions and effects as those shown in FIG. 1 are denoted by the same reference numerals, and the description thereof is omitted. The equivalent circuit of this example is substantially the same as that of FIG. 1 except for the pixel structure which is different in the following points.

In the BDMIS type, unlike the TGMIS type, electrons are used as the signal charge. Accordingly, the column selective transistors 17-1, 17-2, . . . are composed of p-channel transistors, not n-channel transistors.

Since the circuit operations are the same as those shown in FIG. 1, the same effects as those described in Example 1 can be obtained.

As shown in FIG. 9, the constant current load sections 41-1, 41-2, . . . , 41-n can be provided for the respective column lines 16-1, 16-2, . . . , 16-n as in Example 2.

Also, as shown in FIG. 10, as in Example 3, the threshold voltage of the driving transistor 51 of the output impedance converting section may be made smaller than the threshold voltage of the transistors constituting the first vertical scanning circuit 13, the second vertical scanning circuit 15, and the horizontal scanning circuit 21. Alternatively, the driving transistor 51 may be of the depletion type.

With the above configurations, the same effects as those described in Examples 2 and 3 can be obtained.

In Examples 1 to 6, a single-stage output impedance converting section (source follower circuit) was disposed. The same effects can also be obtained by using a multiple-stage output impedance converting section (source follower circuit). When a multiple-stage output impedance converting section is used, the constant current amounts of the load transistors may be gradually increased from the first to last stages to adjust the final gain. In this case, the output terminal of the video line is connected to the gate terminal of the driving transistor 52 of the first stage, and the joint terminal of the driving transistor 52 and the load transistor 32 of the first stage is connected to the gate terminal of the driving transistor of the second stage. This applies to the subsequent stages. That is, the joint terminal of the driving transistor and the load transistor of one stage of the output impedance converting section is connected to the gate terminal of the driving transistor of the next stage, so as to output the image signal from the joint terminal of the driving transistor and the load transistor of the next stage.

Thus, according to the amplification type solid-state imaging device of the present invention, the output impedance converting section is provided. With this configuration, when the amplification type solid-state imaging elements formed in a matrix are sequentially selected by the source/gate selection method, signals of which voltage waveforms are not dulled are output even when influential parasitic capacitances are generated, which tend to be generated when the device is scaled down and the number of pixels is increased. This allows for correct and high-speed readout of signals output from the respective amplification type solid-state imaging elements.

With the constant current source load sections provided on the respective signal lines, charge to be supplied to the parasitic capacitances can be secured for the individual signal lines, allowing for correct and high-speed readout of video signals.

The threshold voltage of the driving transistor of the output impedance converting section is made smaller than the threshold voltage of the transistors constituting the scanning circuits for driving the amplification type solid-state imaging device. Alternatively, a depletion type transistor may be used as the driving transistor. In both cases, the source voltages obtained by the source/gate selection method can be output more correctly.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An amplification type solid-state imaging device comprising:

a plurality of amplification type photoelectric converting elements arranged in a matrix, an output impedance converting section connected to the photoelectric converting elements which sequentially receives the output signals from the amplification type photoelectric converting elements, the output impedance converting section including a driving transistor driven with the output signals and a load transistor; and further comprising a scanning section which allows the respective amplification type photoelectric converting elements to output the output signals and the output signals to be sequentially guided to the output impedance converting section, wherein a threshold voltage of the driving transistor of the output impedance converting section is smaller than a threshold voltage of a transistor used for the scanning section.

2. An amplification type solid-state imaging device according to claim 1, wherein each of the amplification type photoelectric converting elements comprises:

a semiconductor region formed in a surface area of a semiconductor substrate;

a first gate region including a first surface portion of the semiconductor substrate where signal charge generated by photoelectric conversion is accumulated and a first gate electrode formed on the surface portion of the semiconductor substrate;

a second gate region including a second surface portion of the semiconductor substrate adjacent to the first gate region and a second gate electrode formed on the second surface portion via an insulating film; and an active element formed between the semiconductor region and the semiconductor substrate with the surface portion of the first gate region as a channel so that a change in characteristics of the active element caused by the signal charge is used as an output signal.

3. An amplification type solid-state imaging device according to claim 1, further comprising a constant current load section disposed for each signal line which is connected to the output impedance converting section and to which a number of elements aligned in one direction selected from said plurality of amplification type photoelectric converting elements are connected.

* * * * *